United States Patent
Kwak

(10) Patent No.: US 11,481,127 B2
(45) Date of Patent: Oct. 25, 2022

(54) CRYOGENIC TRANSMITTER AND SEMICONDUCTOR MEMORY DEVICE INCLUDING THE SAME

(71) Applicant: SK hynix Inc., Gyeonggi-do (KR)

(72) Inventor: Kang-Sub Kwak, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 460 days.

(21) Appl. No.: 16/578,660

(22) Filed: Sep. 23, 2019

(65) Prior Publication Data

US 2020/0310663 A1    Oct. 1, 2020

(30) Foreign Application Priority Data

Mar. 29, 2019 (KR) .................. 10-2019-0037084

(51) Int. Cl.
| | |
|---|---|
| G06F 3/06 | (2006.01) |
| G11C 7/10 | (2006.01) |
| G11C 5/14 | (2006.01) |
| H03K 3/38 | (2006.01) |

(52) U.S. Cl.
CPC .......... *G06F 3/0634* (2013.01); *G06F 3/0625* (2013.01); *G06F 3/0673* (2013.01); *G11C 5/14* (2013.01); *G11C 7/109* (2013.01); *G11C 7/1051* (2013.01); *H03K 3/38* (2013.01)

(58) Field of Classification Search
CPC ......... G06F 3/0634; G11C 5/14; G11C 7/109; G11C 7/20; G11C 7/1066; H03K 19/1956; H03K 19/195
See application file for complete search history.

(56) References Cited

U.S. PATENT DOCUMENTS

| | | | | |
|---|---|---|---|---|
| 6,275,441 | B1* | 8/2001 | Oh ........................ | G11C 7/1006 365/189.18 |
| 6,351,150 | B1* | 2/2002 | Krishnamurthy .. | H03K 19/0016 326/93 |
| 2005/0243708 | A1* | 11/2005 | Bunyk ................ | H04L 49/1507 370/200 |
| 2017/0324019 | A1 | 11/2017 | Ware et al. | |
| 2020/0401166 | A1* | 12/2020 | Nam ....................... | G05F 1/575 |

FOREIGN PATENT DOCUMENTS

KR    10-0861291    10/2008

\* cited by examiner

*Primary Examiner* — Vincent H Tran
(74) *Attorney, Agent, or Firm* — IP & T Group LLP

(57) ABSTRACT

A semiconductor memory device includes a memory region from which first data and second data are sequentially read, and a data output circuit suitable for selectively performing a reset operation on a data pad according to a logical relationship between the first and second data during an output disable period between a first output enable period corresponding to first output data and a second output enable period corresponding to second output data, when sequentially outputting the first and second output data corresponding to the first and second data through the data pad.

26 Claims, 14 Drawing Sheets

CRYOGENIC TRANSMITTER AND SEMICONDUCTOR MEMORY DEVICE INCLUDING THE SAME

CROSS-REFERENCE TO RELATED APPLICATION

This application claims priority under 35 U.S.C. § 119 to Korean Patent Application No. 10-2019-0037084, filed on Mar. 29, 2019, the disclosure of which is incorporated herein by reference in its entirety.

BACKGROUND

1. Field

Various embodiments relate to a semiconductor design technique, and more particularly, to a cryogenic transmitter and a semiconductor memory device including the transmitter.

2. Description of the Related Art

The related art, i.e., US Patent Publication No. US 2017-0324019, includes a transmitter using Josephson junctions. The transmitter in accordance with the related art effectively transmits a signal in a cryogenic environment by utilizing hysteresis characteristics of the Josephson junctions.

However, the transmitter in accordance with the related art has the following concerns.

In the transmitter in accordance with the related art, supply voltages supplied to the transmitter are varied to adjust a current flowing in the Josephson junctions. Typically, in order to stabilize levels of supply voltages, decoupling capacitors are coupled to supply voltage terminals. Therefore, a large amount of time is required due to an RC delay when levels of the supply voltages are varied, and large power consumption is required due to a charging/discharging operation of the decoupling capacitors.

SUMMARY

Various embodiments are directed to a semiconductor device including a low-power and high-speed cryogenic transmitter.

In accordance with an embodiment, a semiconductor memory device includes: a memory region from which first data and second data are sequentially read; and a data output circuit suitable for selectively performing a reset operation on a data pad according to a logical relationship between the first and second data during an output disable period between a first output enable period corresponding to first output data and a second output enable period corresponding to second output data, when sequentially outputting the first and second output data corresponding to the first and second data through the data pad.

The data output circuit may perform the reset operation by transitioning a power supply voltage from a target level to a reset level during the output disable period or skips the reset operation by maintaining the power supply voltage at the target level during the output disable period, and the power supply voltage may include a voltage used when the first and second output data are outputted, and has the target level during the first output enable period and the second output enable period.

The data output circuit may perform the reset operation by adjusting a resistance value of a path of an internal current from a low resistance value to a high resistance value during the output disable period or skips the reset operation by maintaining the resistance value of the path of the internal current as the low resistance value during the output disable period, the internal current may include an output current which becomes a basis when the first and second output data are outputted, and the resistance value of the path of the internal current may have the low resistance value during the first output enable period and the second output enable period.

In accordance with an embodiment, a semiconductor memory device includes: a memory region from which first data and second data are sequentially read; a storage circuit suitable for storing the first data and outputting the stored first data as third data when the second data is read; a control circuit suitable for generating a reset control signal and an input data control signal based on the first to third data; a power supply circuit suitable for generating a high voltage and a low voltage each having a target level during a first output enable period and a second output enable period, in response to the reset control signal, and transitioning each of the high and low voltages from the target level to a reset level or maintaining each of the high and low voltages at the target level, according to a logical relationship between the second data and the third data during an output disable period between the first output enable period and the second output enable period; and an output circuit suitable for receiving the high and low voltages, and outputting first output data corresponding to the first data to a data pad during the first output enable period and outputting second output data corresponding to the second data to the data pad during the second output enable period, based on the input data control signal.

The power supply circuit may maintain each of the high and low voltages at the target level when a logic level of the second data is equal to a logic level of the third data, and the output circuit may skip a reset operation on the data pad during the output disable period when the logic level of the second data is equal to the logic level of the third data.

The power supply circuit may transition each of the high and low voltages from the target level to the reset level when a logic level of the second data is different from a logic level of the third data, and the output circuit performs a reset operation on the data pad during the output disable period when the logic level of the second data is different from the logic level of the third data.

The control circuit may deactivate the reset control signal during the first and second output enable periods. The control circuit may deactivate the reset control signal when a logic level of the second data is equal to a logic level of the third data, and activate the reset control signal when the logic level of the second data is different from the logic level of the third data, during the output disable period.

The control circuit may determine whether to activate the input data control signal according to the first data during the first output enable period. The control circuit may deactivate the input data control signal regardless of the second data during the second output enable period when a logic level of the second data is equal to a logic level of the third data, and determine whether to activate the input data control signal according to the second data during the second output enable period when the logic level of the second data is different from the logic level of the third data. The control circuit may deactivate the input data control circuit during the output disable period.

The control circuit may include: a comparison circuit suitable for comparing the second data with the third data, and generating a comparison signal corresponding to the comparison result; an input data control circuit suitable for generating the input data control signal based on the first and second data and the comparison signal; and a reset control circuit suitable for generating the reset control signal according to the comparison signal.

The output circuit may include one or more Josephson junctions.

In accordance with an embodiment, a semiconductor memory device includes: a memory region from which first data and second data are sequentially read; a storage circuit suitable for storing the first data and outputting the stored first data as third data when the second data is read; a control circuit suitable for generating a reset control signal and an input data control signal based on the first to third data; a power supply circuit suitable for generating a high voltage and a low voltage each having a constant voltage level; and an output circuit suitable for receiving the high and low voltages, and sequentially outputting first output data and second output data corresponding to the first data and the second data, respectively, to a data pad by controlling an internal current during a first output enable period and a second output enable period and performing or skipping a reset operation on the data pad by adjusting a resistance value of a path of the internal current during an output disable period between the first and second output enable periods, in response to the reset control signal and the input data control signal.

The internal current may be generated in the output circuit, and become a basis when the first and second output data are outputted.

The output circuit may adjust the resistance value relatively low during the first and second output enable periods. The output circuit may perform the reset operation by adjusting the resistance value relatively high when a logic level of the first data is different from a logic level of the second data, and skip the reset operation by keeping the resistance value relatively low when the logic level of the first data is equal to the logic level of the second data, during the output disable period.

The control circuit may deactivate the reset control signal during the first and second output enable periods. The control circuit may deactivate the reset control signal when a logic level of the second data is equal to a logic level of the third data, and activate the reset control signal when the logic level of the second data is different from the logic level of the third data, during the output disable period.

The control circuit may determine whether to activate the input data control signal according to the first data during the first output enable period. The control circuit may deactivate the input data control signal regardless of the second data during the second output enable period when a logic level of the second data is equal to a logic level of the third data, and determine whether to activate the input data control signal according to the second data during the second output enable period when the logic level of the second data is different from the logic level of the third data. The control circuit may deactivate the input data control circuit during the output disable period.

The control circuit may include: a comparison circuit suitable for comparing the second data with the third data, and generating a comparison signal corresponding to the comparison result; an input data control circuit suitable for generating the input data control signal based on the first and second data and the comparison signal; and a reset control circuit suitable for generating the reset control signal according to the comparison signal.

The output circuit may include one or more Josephson junctions.

The output circuit may include: a fixed resistance element coupled between a supply terminal of the high voltage and a first supply node; a variable resistance element coupled between a supply terminal of the low voltage and a second supply node, and having a resistance value which is varied in response to the reset control signal; a first current path coupled between the first and second supply nodes, and including one or more first Josephson junctions coupled in series and a first resistance element; and a second current path coupled between the first and second supply nodes, and including one or more second Josephson junctions coupled in series and a second resistance element. The input data control signal may be inputted through an input node between each of the first Josephson junctions and the first resistance element. The first and second output data may be outputted through an output node between the second Josephson junctions and the second resistance element.

The output circuit may include: a variable resistance element coupled between a supply terminal of the high voltage and a first supply node, and having a resistance value which is varied in response to the reset control signal; a fixed resistance element coupled between a supply terminal of the low voltage and a second supply node; a first current path coupled between the first and second supply nodes, and including one or more first Josephson junctions coupled in series and a first resistance element; and a second current path coupled between the first and second supply nodes, and including one or more second Josephson junctions coupled in series and a second resistance element. The input data control signal may be inputted through an input node between the first Josephson junctions and the first resistance element. The first and second output data may be outputted through an output node between the second Josephson junctions and the second resistance element.

The output circuit may include: a first variable resistance element coupled between a supply terminal of the high voltage and a first supply node, and having a resistance value which is varied in response to the reset control signal; a second variable resistance element coupled between a supply terminal of the low voltage and a second supply node, and having a resistance value which is varied in response to the reset control signal; a first current path coupled between the first and second supply nodes, and including one or more first Josephson junctions coupled in series and a first resistance element; and a second current path coupled between the first and second supply nodes, and including one or more second Josephson junctions coupled in series and a second resistance element. The input data control signal may be inputted through an input node between the first Josephson junctions and the first resistance element. The first and second output data may be outputted through an output node between the second Josephson junctions and the second resistance element.

In accordance with an embodiment, a transmitter includes: an output circuit configured to output first data during a first output enable period and output second data during a second output enable period, to a data output terminal in a superconducting state or a voltage state depending on values of the first and second data; and a power supply circuit configured to supply a high voltage and a low voltage which have target levels during the first and second output enable periods, to the output circuit. When the first and second data have different values, the high voltage and the low voltage may have reset levels during an output disable period between the first and second output enable periods. When the first and second data have a same value, the high voltage and the low voltage may maintain target levels during the output disable period.

The transmission circuit may include: an input current path including first Josephson junctions and a first resistance element coupled in series; and an output current path including second Josephson junctions and a second resistance element coupled in series.

The transmitter may further include: a storage circuit configured to store sequentially inputted data and sequentially output the stored data as the first and second data; a comparison circuit configured to compare the values of the first and second data to generate a comparison signal; and a reset control circuit configured to generate a reset control signal according to the comparison signal, and provide the reset control signal to the power supply circuit, wherein the reset control signal is deactivated during the output disable period when the first and second data have a same value.

The transmitter may further include: an input data control circuit configured to generate an input data control signal based on the first and second data and the comparison signal, and provide the input data control signal to the output circuit.

In accordance with an embodiment, a transmitter includes: a transmission circuit configured to output first data during a first output enable period and output second data during a second output enable period, to an output terminal in a superconducting state or a voltage state depending on values of the first and second data; and a variable resistance element coupled to at least one of first and second supply voltage terminals of the transmission circuit, and configured to have, in response to a reset control signal, a first resistance value to allow at least a supply voltage having constant target level to be supplied to the transmission circuit during the first and second data output enable periods, and a second resistance value to block supplying of the supply voltage to the transmission circuit during an output disable period between the first and second output enable periods. When the first and second data have a same value, the reset control signal may be deactivated to allow at least the supply voltage to be supplied to the transmission circuit during the output disable period.

The transmission circuit may include: an input current path including first Josephson junctions and a first resistance element coupled in series; and an output current path including second Josephson junctions and a second resistance element coupled in series.

The transmitter may further include: a storage circuit configured to store sequentially inputted data and sequentially output the stored data as the first and second data; a comparison circuit configured to compare the values of the first and second data to generate a comparison signal; and a reset control circuit configured to generate the reset control signal according to the comparison signal, and provide the reset control signal to the variable resistance element, wherein the reset control signal is deactivated during the output disable period when the first and second data have a same value.

The transmitter may further include: an input data control circuit configured to generate an input data control signal based on the first and second data and the comparison signal, and provide the output control signal to the transmission circuit.

DETAILED DESCRIPTION

Figure 1:
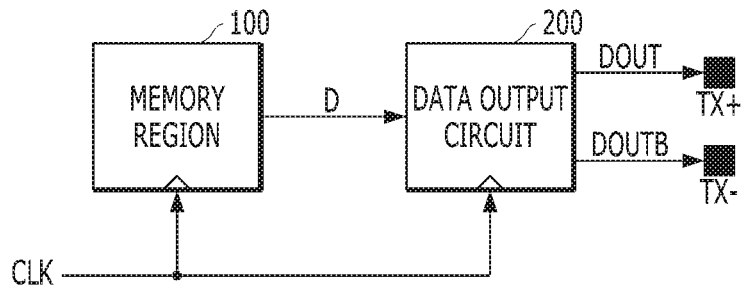
FIG. 1 is a block diagram illustrating a semiconductor memory device in accordance with an embodiment of the present invention.

Various embodiments of the present invention are described below in more detail with reference to the accompanying drawings. The present invention may, however, be embodied in different forms and should not be construed as limited to the embodiments set forth herein. Rather, these embodiments are provided so that this disclosure is thorough and complete, and fully conveys the scope of the present invention to those skilled in the art. Throughout the disclosure, like reference numerals refer to like parts throughout the various figures and embodiments of the present invention.

It is noted that reference to "an embodiment," "another embodiment" or the like does not necessarily mean only one embodiment, and different references to any such phrase are not necessarily to the same embodiment(s).

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

As used herein, singular forms may include the plural forms as well and vice versa, unless the context clearly indicates otherwise. The articles 'a' and 'an' as used in this application and the appended claims should generally be construed to mean 'one or more' unless specified otherwise or clear from context to be directed to a singular form.

FIG. 1 is a block diagram illustrating a semiconductor memory device in accordance with an embodiment of the present invention.

Referring to FIG. 1, the semiconductor memory device may include a memory region 100 and a data output circuit 200 (i.e., a cryogenic transmitter).

The memory region 100 may store data and output data D having a predetermined burst length based on a clock signal CLK. When the burst length is set to '4', the memory region 100 may sequentially output 4-bit data D. Hereinafter, for convenience in description, it will be described as an example that 2-bit data D are sequentially outputted. The data outputted first between the 2-bit data 'D' is referred to as "first data D1", and the data outputted next is referred to as "second data D2".

The data output circuit 200 may output differential output data DOUT and DOUTB corresponding to the data D to data pads (i.e., data output terminals) TX+ and TX− based on the clock signal CLK. For example, the data output circuit 200 may output first differential data corresponding to the first data D1 as the differential output data DOUT and DOUTB to the data pads TX+ and TX− during a first bit interval AA1, and then output second differential data corresponding to the second data D2 as the differential output data DOUT and DOUTB to the data pads TX+ and TX− during a second bit interval AA2.

When sequentially outputting the first and second differential data to the data pads TX+ and TX−, the data output circuit 200 may perform or skip a reset operation on the data pads TX+ and TX− during an output disable period CC1 according to a logical relationship between the first data D1 and the second data D2. The first bit interval AA1 may include a first output enable period BB1 in which the first differential data are substantially outputted, the second bit interval AA2 may include a second output enable period BB2 in which the second differential data are substantially outputted, and the output disable period CC1 may include a period between the first output enable period BB1 and the second output enable period BB2. The output disable period CC1 may include a boundary period between the first bit interval AA1 and the second bit interval AA2 (refer to FIGS. 5 to 8).

For example, the data output circuit 200 may perform the reset operation on the data pads TX+ and TX− by transitioning a power supply voltage from a target level to a reset level or skip the reset operation by keeping the power supply voltage at the target level, according to the logical relationship between the first data D1 and the second data D2. The power supply voltage may include a high voltage +Vs and a low voltage −Vs which are used as supply voltages (i.e., power sources) for outputting the differential output data DOUT and DOUTB. The high voltage +Vs and the low voltage −Vs will be described below.

Figure 2:
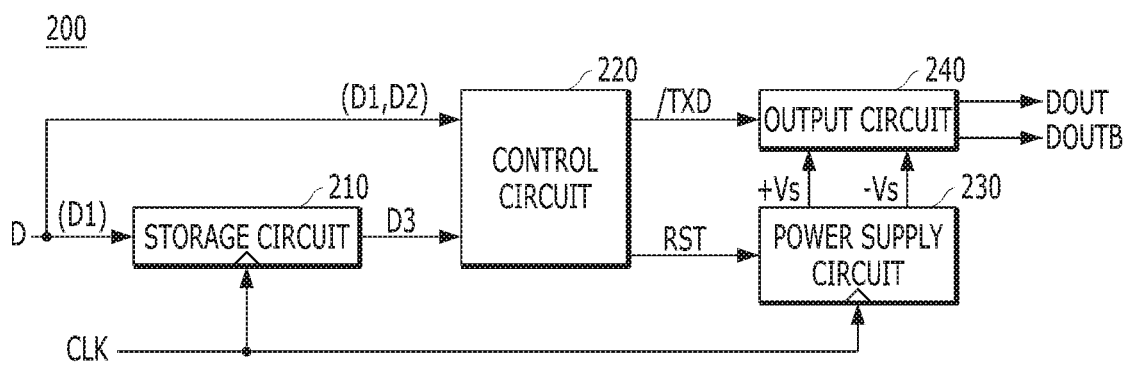
FIG. 2 is a detailed diagram of a data output circuit shown in FIG. 1.

FIG. 2 is a detailed diagram of the data output circuit 200 shown in FIG. 1.

Referring to 2, the data output circuit 200 may include a storage circuit 210, a control circuit 220, a power supply circuit 230 and an output circuit 240.

The storage circuit 210 may store the first data D1 and output the stored first data as third data D3 to the control circuit 220, based on the clock signal CLK. The third data D3 may be outputted when the second data D2 is read. In other words, the storage circuit 210 may sequentially store the first data D1 and the second data D2, and output the first data, which is stored first, as the third data D3 to the control circuit 220 when storing the second data D2 therein. A logic level of the first data D1 may be equal to a logic level of the third data D3.

The control circuit 220 may generate a reset control signal RST and an input data control signal/TXD based on the first to third data D1, D2 and D3. For example, the control circuit 220 may generate the reset control signal RST according to a logical relationship between the second data D2 and the third data D3, and generate the input data control signal/TXD based on the logical relationship and the first and second data D1 and D2. A logic level of the reset control signal RST and a logic level of the input data control signal/TXD depending on the logical relationship between the second data D2 and the third data D3 are shown in Table 1 below. Table 1 shows the logic level of the reset control signal RST in the output disable period CC1 and the logic level of the input data control signal/TXD in the second output enable period BB2 in accordance with the concept of the present invention.

TABLE 1

| D3 (=D1) | D2 | RST | /TXD |
|---|---|---|---|
| 0 | 0 | 0 | 0 |
| 0 | 1 | 1 | 0 |
| 1 | 0 | 1 | 1 |
| 1 | 1 | 0 | 0 |

Referring to Table 1, when the logic level of the third data D3 is equal to a logic level of the second data D2, the control circuit 220 may deactivate the reset control signal RST to a logic low level (e.g., '0') during the output disable period CC1. On the other hand, when the logic level of the third data D3 is different from the logic level of the second data D2, the control circuit 220 may activate the reset control signal RST to a logic high level (e.g., '1') during the output disable period CC1.

Continuously referring to Table 1, when the logic level of the third data D3 is equal to the logic level of the second data D2, the control circuit 220 may deactivate the input data control signal/TXD to the logic low level ('0') regardless of the logic level of the second data D2 during the second output enable period BB2. On the other hand, when the logic level of the third data D3 is different from the logic level of the second data D2, the control circuit 220 may determine whether to activate the input data control signal/TXD according to the second data D2 during the second output enable period BB2. For example, when the logic level of the third data D3 is different from the logic level of the second data D2, the control circuit 220 may deactivate the input data control signal/TXD to the logic low level ('0') in the case that the second data D2 has the logic high level ('1'), and activate the input data control signal/TXD to the logic high level ('1') in the case that the second data D2 has the logic low level ('0').

The power supply circuit 230 may generate the high voltage +Vs and the low voltage −Vs in response to the reset control signal RST. For example, the power supply circuit 230 may generate the high voltage +Vs and the low voltage −Vs having respective target levels during the first output enable period BB1 and the second output enable period BB2, and generate the high voltage +Vs and the low voltage −Vs that have transitioned from the respective target levels to a reset level during the output disable period CC1 or generate the high voltage +Vs and the low voltage −Vs that maintain the respective target levels during the output disable period CC1.

The output circuit 240 may receive the high voltage +Vs and the low voltage −Vs from the power supply circuit 230. The output circuit 240 may output the differential output data DOUT and DOUTB corresponding to the first data D1 during the first output enable period BB1, and then output the differential output data DOUT and DOUTB corresponding to the second data D2 during the second output enable period BB2, based on the input data control signal/TXD. The output circuit 240 may perform the reset operation on the data pads TX+ and TX− during the output disable period CC1, when the logic level of the second data D2 is different from the logic level of the third data D3. The output circuit 240 may skip the reset operation on the data pads TX+ and TX− during the output disable period CC1, when the logic level of the second data D2 is equal to the logic level of the third data D3.

Figure 3:
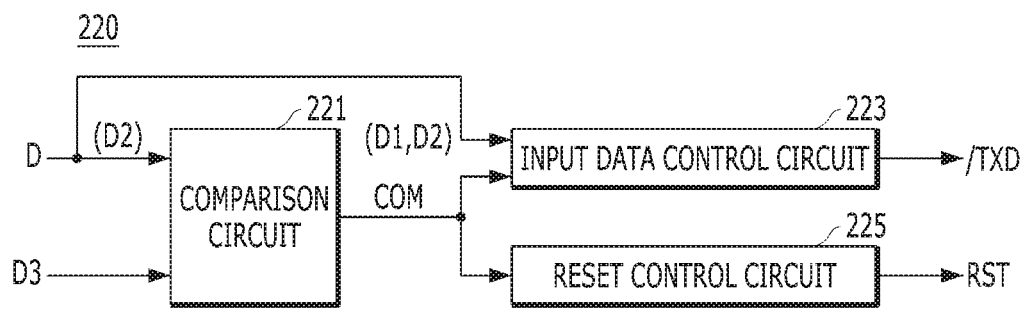
FIG. 3 is a detailed diagram of a control circuit shown in FIG. 2.

FIG. 3 is a detailed diagram of the control circuit 220 shown in FIG. 2.

Referring to FIG. 3, the control circuit 220 may include a comparison circuit 221, an input data control circuit 223 and a reset control circuit 225.

The comparison circuit 221 may compare the second data D2 with the third data D3, and generate a comparison signal COM corresponding to the comparison result. For example, the comparison circuit 221 may generate the comparison signal COM at a logic low level when the logic level of the second data D2 is equal to the logic level of the third data D3, and generate the comparison signal COM at a logic high level when the logic level of the second data D2 is different from the logic level of the third data D3.

The input data control circuit 223 may generate the input data control signal/TXD based on the first data D1, the second data D2 and the comparison signal COM. The input data control circuit 223 may determine whether to activate the input data control signal/TXD according to the first data D1 during the first output enable period BB1. For example, the input data control circuit 223 may deactivate the input data control signal/TXD according to the first data D1 having the logic high level or activate the input data control signal /TXD according to the first data D1 having the logic low level, during the first output enable period BB1. The input data control circuit 223 may whether to activate the input data control signal/TXD based on the second data D2 and the comparison signal COM during the second output enable period BB2. For example, during the second output enable period BB2, the input data control circuit 223 may deactivate the input data control signal/TXD regardless of the second data D2 when the comparison signal COM has the logic low level, deactivate the input data control signal/TXD when the comparison signal COM and the second data D2 have the logic high levels, and activate the input data control signal/TXD when the comparison signal COM has the logic high level and the second data D2 has the logic low level. The input data control circuit 223 may deactivate the input data control signal/TXD during the output disable period CC1.

The reset control circuit 225 may generate the reset control signal RST according to the comparison signal COM. For example, during the output disable period CC1, the reset control circuit 225 may deactivate the reset control signal RST according to the comparison signal COM having the logic low level, and activate the reset control signal RST according to the comparison signal COM having the logic high level. The reset control circuit 225 may deactivate the reset control signal RST during the first and second output enable periods BB1 and BB2.

Figure 4:
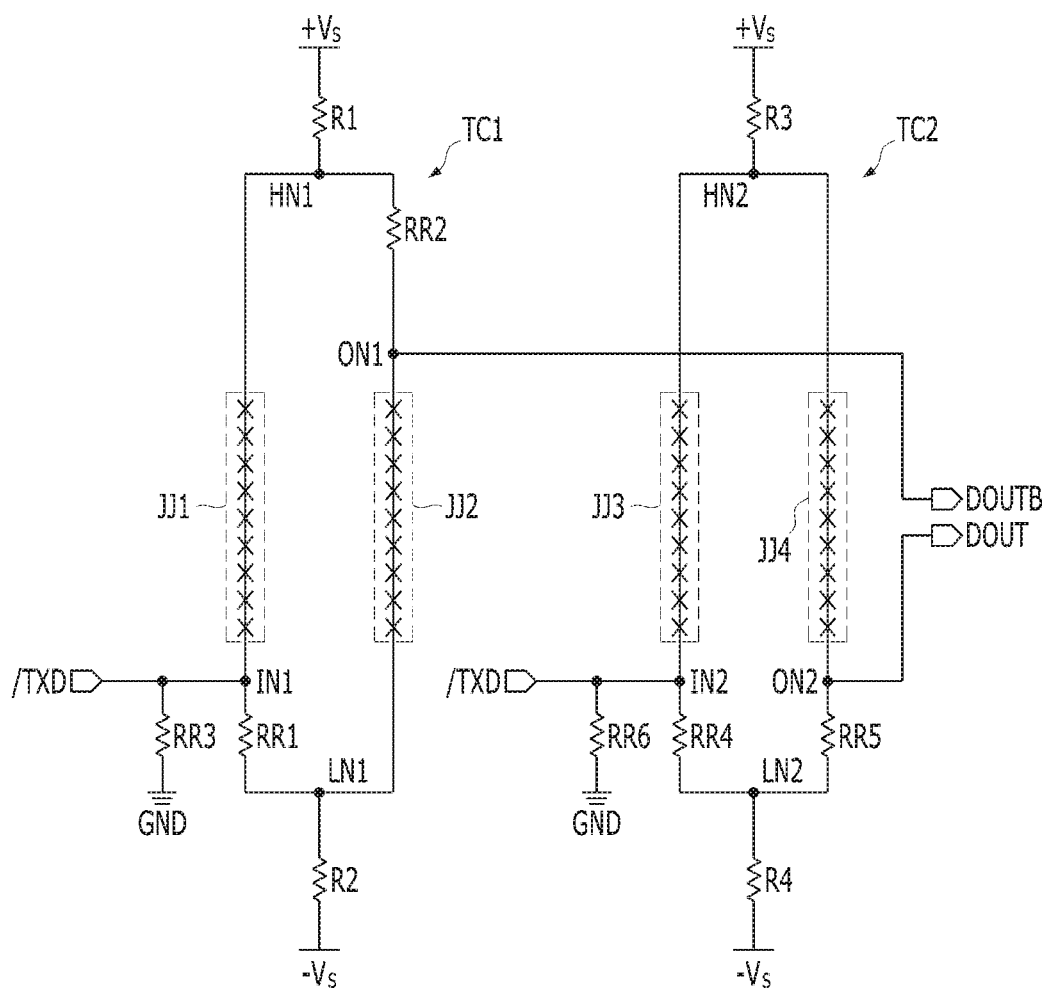
FIG. 4 is a detailed diagram of an output circuit shown in FIG. 2.

FIG. 4 is a detailed diagram of the output circuit 240 shown in FIG. 2.

Referring to FIG. 4, the output circuit 240 may include a first resistance element R1, a second resistance element R2, a first transmission circuit TC1, a third resistance element R3, a fourth resistance element R4 and a second transmission circuit TC2.

The first resistance element R1 may be coupled between a supply terminal of the high voltage +Vs and a first high voltage supply node HN1. The first resistance element R1 may serve as a header current source (i.e., a sourcing current source).

The second resistance element R2 may be coupled between a supply terminal of the low voltage −Vs and a first low voltage supply node LN1. The second resistance element R2 may serve as a tail current source (i.e., a sinking current source).

The first transmission circuit TC1 may be coupled between the first high voltage supply node HN1 and the first low voltage supply node LN1. The first transmission circuit TC1 may generate the output data bar (i.e., complementary output data) DOUTB of the differential output data DOUT and DOUTB corresponding to the first data D1 during the first output enable period BB1, and generate the output data bar DOUTB of the differential output data DOUT and DOUTB corresponding to the second data D2 during the second output enable period BB2, based on the input data control signal/TXD. For example, the first transmission circuit TC1 may include a first input current path and a first output current path.

The first input current path may be coupled between the first high voltage supply node HN1 and the first low voltage supply node LN1. The first input current path may include a plurality of first Josephson junctions 31I and a fifth resistance element RR1. The plurality of first Josephson junctions JJ1 may be coupled in series between the first high voltage supply node HN1 and a first input node IN1. The first input node IN1 may be a node to which the input data control signal/TXD is inputted. The fifth resistance element RR1 may be coupled between the first input node IN1 and the first low voltage supply node LN1.

For reference, a Josephson junction may have a superconducting state (State X) or a voltage state (State Y) depending on the magnitude of a current flowing therethrough. The superconducting state (State X) refers to a state where a resistance value of the Josephson junction is 'zero' when a current equal to or less than a threshold value flows through the Josephson junction, and the voltage state (State Y) refers to a state where the resistance value of the Josephson junction is 'nonzero' when a current greater than the threshold value flows through the Josephson junction.

The first output current path may be coupled between the first high voltage supply node HN1 and the first low voltage supply node LN1. The first output current path may include a sixth resistance element RR2 and a plurality of second Josephson junctions JJ2. The sixth resistance element RR2 may be coupled between the first high voltage supply node HN1 and a first output node ON1. The first output node ON1 may be a node through which the output data bar DOUTB is outputted. The plurality of second Josephson junctions JJ2 may be coupled in series between the first output node ON1 and the first low voltage supply node LN1.

The first transmission circuit TC1 may further include a seventh resistance element RR3 coupled between the first input node IN1 and a supply terminal of a ground voltage GND.

The third resistance element R3 may be coupled between the supply terminal of the high voltage +Vs and a second high voltage supply node HN2. The third resistance element R3 may serve as the header current source.

The fourth resistance element R4 may be coupled between the supply terminal of the low voltage −Vs and a second low voltage supply node LN2. The fourth resistance element R4 may serve as the tail current source.

The second transmission circuit TC2 may be coupled between the second high voltage supply node HN2 and the second low voltage supply node LN2. The second transmission circuit TC2 may generate the output data DOUT of the differential output data DOUT and DOUTB corresponding to the first data D1 during the first output enable period BB1, and generate the output data DOUTB of the differential output data DOUT and DOUTB corresponding to the second data D2 during the second output enable period BB2, based on the input data control signal/TXD. For example, the second transmission circuit TC2 may include a second input current path and a second output current path.

The second input current path may be coupled between the second high voltage supply node HN2 and the second low voltage supply node LN2. The second input current path may include a plurality of third Josephson junctions JJ3 and an eighth resistance element RR4. The plurality of third Josephson junctions JJ3 may be coupled in series between the second high voltage supply node HN2 and a second input node IN2. The second input node IN2 may be a node to which the input data control signal/TXD is inputted. The eighth resistance element RR4 may be coupled between the second input node IN2 and the second low voltage supply node LN2.

The second output current path may be coupled between the second high voltage supply node HN2 and the second low voltage supply node LN2. The second output current path may include a plurality of fourth Josephson junctions JJ4 and a ninth resistance element RR5. The plurality of fourth Josephson junctions JJ4 may be coupled in series between the second high voltage supply node HN2 and a second output node ON2. The second output node ON2 may be a node through which the output data DOUT is outputted. The ninth resistance element RR5 may be coupled between the second output node ON2 and the second low voltage supply node LN2.

The second transmission circuit TC2 may further include a $10^{th}$ resistance element RR6 coupled between the second input node IN2 and the supply terminal of the ground voltage GND. For example, each of the resistance elements R1, R2, R3, R4, RR1, RR2, RR3, RR4, RR5 and RR6 may be embodied with a passive resistor or an MOS transistor.

Hereinafter, an operation of the semiconductor memory device having the above-described configuration will be described with reference to FIGS. 5 to 8.

Reference numerals of which each is applied as the same representation in FIGS. 5 to 8 are described in advance. The first and second bit intervals AA1 and AA2 refer to time required for transmitting the first and second data D1 and D2, respectively. The first and second bit intervals AA1 and AA2 may be continuous to each other. The first bit interval AA1 may include the first output enable period BB1. The first output enable period BB1 may include the minimum amount of time required for a receiver (not illustrated) to receive one-bit data, i.e., a receive window. The second bit interval AA2 may include the second output enable period BB2. The second output enable period BB2 may include the minimum amount of time for the receiver to receive one-bit data, i.e., the receive window. The output disable period CC1 may be included between the first output enable period BB1 and the second output enable period BB2. The output disable period CC1 refers to a period in which the reset operation on the data pads TX+ and TX− is performed or skipped. The first output enable period BB1, the output disable period CC1 and the second output enable period BB2 may be continuous to one another.

Figure 5:
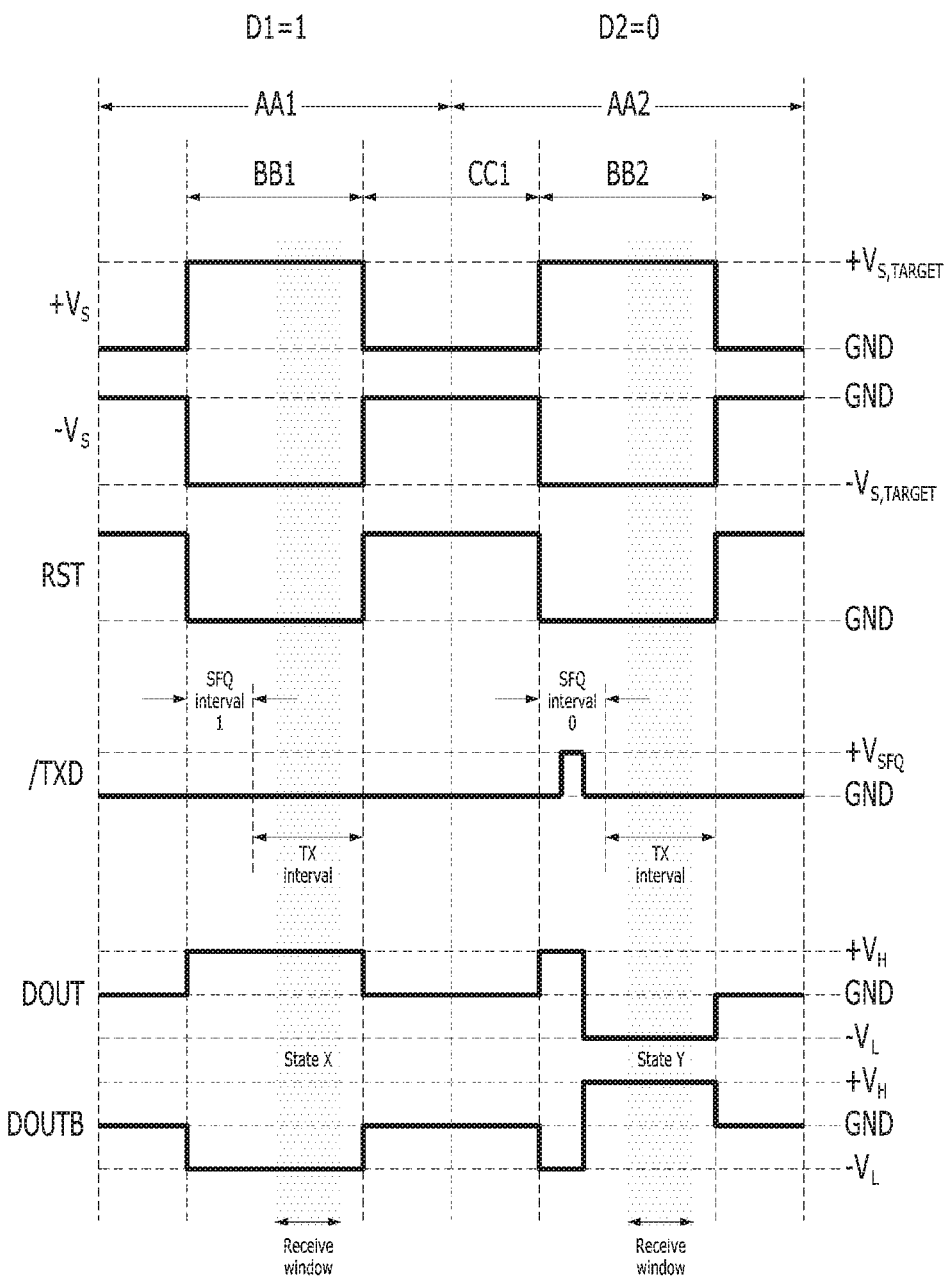
FIGS. 5 to 8 are timing diagrams for describing operations of the semiconductor memory device shown in FIG. 1.

FIG. 5 is a timing diagram for describing an operation of the semiconductor memory device when the logic level of the first data D1 and the logic level of the second data D2 are '10'.

Referring to FIG. 5, the data output circuit 200 may perform the reset operation on the data pads TX+ and TX− before the data D is read from the memory region 100. For example, the data output circuit 200 may generate the high voltage +Vs and the low voltage −Vs at a level corresponding to the ground voltage GND during an initial period of the first bit interval AA1, thereby resetting the differential output data DOUT and DOUTB to the level corresponding to the ground voltage GND. The first to fourth Josephson junctions JJ1, JJ2, JJ3, and JJ4 included in the data output circuit 200 may be reset to the superconducting state (State X).

In this state, the memory region 100 may sequentially read out the first and second data D1 and D2 from first and second memory cells selected based on a read command and an address.

The data output circuit 200 may output the differential output data DOUT and DOUTB corresponding to the first data D1 to the data pads TX+ and TX− during the first output enable period BB1. For example, the input data control signal/TXD may be deactivated in response to the first data D1 having the logic high level (i.e., '1') during the first output enable period BB1 (specifically, during a SFQ interval 1 of the first output enable period BB1), and thus the differential output data DOUT and DOUTB corresponding to the first data D1 having the logic high level ('1') may be outputted (specifically, during a TX interval of the first output enable period BB1). The first to fourth Josephson junctions JJ1, JJ2, JJ3, and JJ4 included in the data output circuit 200 may maintain the superconducting state (State X).

The data output circuit 200 may output the differential output data DOUT and DOUTB corresponding to the second data D2 to the data pads TX+ and TX− during the second output enable period BB2. For example, the input data control signal/TXD may be activated in response to the second data D2 having the logic low level (i.e., '0') during the second output enable period BB2 (specifically, during a SFQ interval 0 of the second output enable period BB2), and thus the differential output data DOUT and DOUTB corresponding to the second data D2 having the logic low level ('0') may be outputted (specifically, during a TX interval of the second output enable period BB2). The first to fourth Josephson junctions JJ1, JJ2, JJ3, and JJ4 included in the data output circuit 200 may have the voltage state (State Y). In the figure, '+$V_{SFQ}$' denotes a magnitude of a pulse of the input data control signal/TXD; '+$V_H$' and '−$V_L$' denote magnitudes of the output data DOUT corresponding to a data value '1' and '0'; and '+$V_{S,TARGET}$' and '−$V_{S,TARGET}$' denote target levels of the high voltage +Vs and the low voltage −Vs.

Since the logic level (i.e., '1') of the first data D1 is different from the logic level (i.e., '0') of the second data D2, the data output circuit 200 may perform the reset operation on the data pads TX+ and TX− during the output disable period CC1. In other words, the differential output data DOUT and DOUTB may be reset to the level corresponding to the ground voltage GND during the output disable period CC1.

Figure 6:
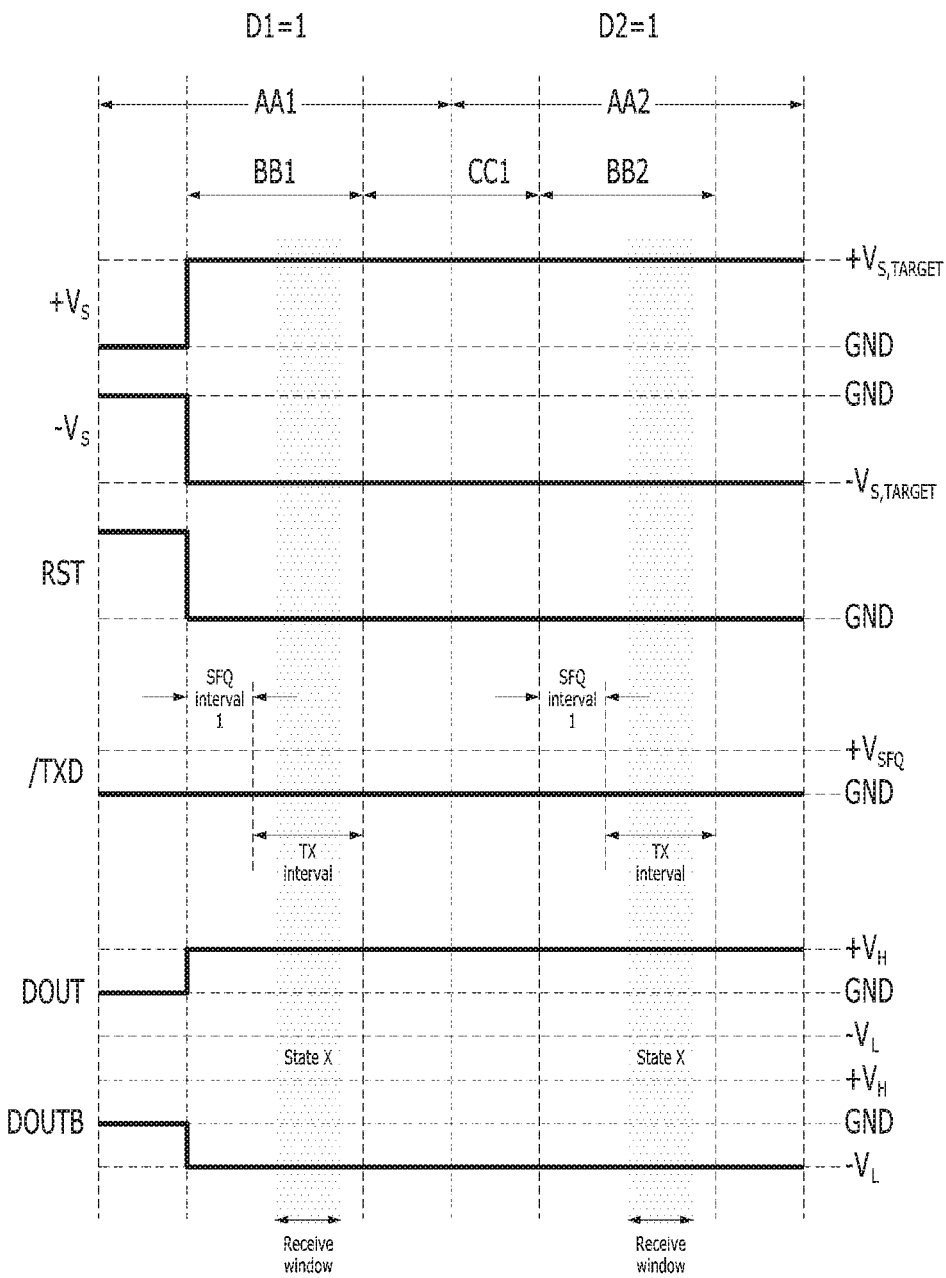

FIG. 6 is a timing diagram for describing an operation of the semiconductor memory device when the logic level of the first data D1 and the logic level of the second data D2 are '11'.

Referring to FIG. 6, the data output circuit 200 may perform the reset operation on the data pads TX+ and TX− before the data D is read from the memory region 100. For example, the data output circuit 200 may generate the high voltage +Vs and the low voltage −Vs at a level corresponding to the ground voltage GND during an initial period of the first bit interval AA1, thereby resetting the differential output data DOUT and DOUTB to the level corresponding to the ground voltage GND. The first to fourth Josephson junctions JJ1, JJ2, JJ3, and JJ4 included in the data output circuit 200 may be reset to the superconducting state (State X).

In this state, the memory region 100 may sequentially read out the first and second data D1 and D2 from first and second memory cells selected based on a read command and an address.

The data output circuit 200 may output the differential output data DOUT and DOUTB corresponding to the first data D1 to the data pads TX+ and TX− during the first output enable period BB1. For example, the input data control signal/TXD may be deactivated in response to the first data D1 having the logic high level (i.e., '1') during the first output enable period BB1, and thus the differential output data DOUT and DOUTB corresponding to the first data D1 having the logic high level ('1') may be outputted. The first to fourth Josephson junctions JJ1, JJ2, JJ3, and JJ4 included in the data output circuit 200 may maintain the superconducting state (State X).

The data output circuit 200 may output the differential output data DOUT and DOUTB corresponding to the second data D2 to the data pads TX+ and TX− during the second output enable period BB2. For example, the input data control signal/TXD may be deactivated in response to the second data D2 having the logic high level (i.e., '1') during the second output enable period BB2, and thus the differential output data DOUT and DOUTB corresponding to the second data D2 having the logic high level ('1') may be outputted. The first to fourth Josephson junctions JJ1, JJ2, JJ3, and JJ4 included in the data output circuit 200 may maintain the superconducting state (State X).

Since the logic level (i.e., '1') of the first data D1 is equal to the logic level (i.e., '1') of the second data D2, the data output circuit 200 may skip the reset operation on the data pads TX+ and TX− during the output disable period CC1. In other words, the voltage levels of the differential output data DOUT and DOUTB in the first output enable period BB1 may be equally maintained even in the output disable period CC1.

Figure 7:
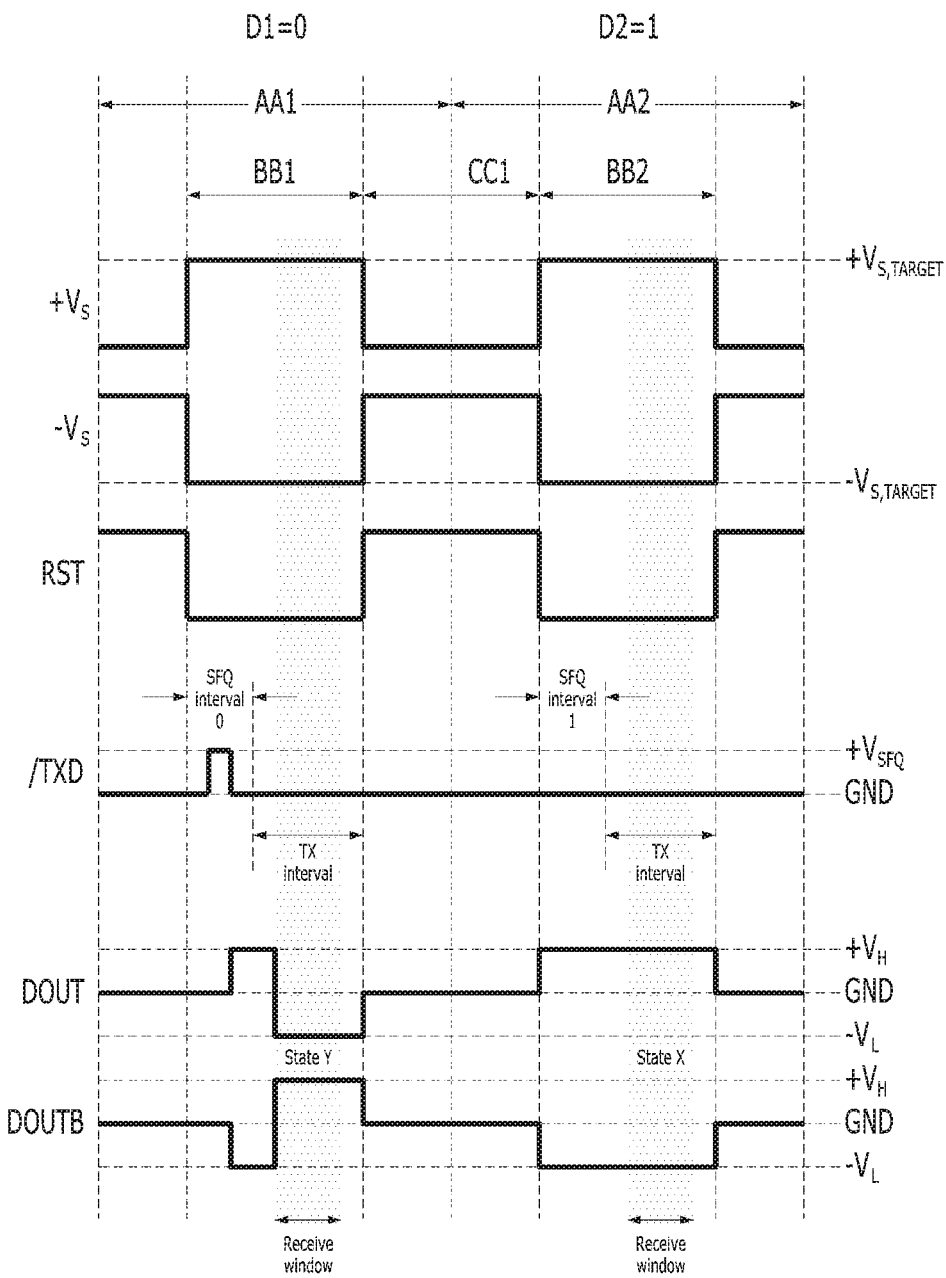

FIG. 7 is a timing diagram for describing an operation of the semiconductor memory device when the logic level of the first data D1 and the logic level of the second data D2 are '01'.

Referring to FIG. 7, the data output circuit 200 may perform the reset operation on the data pads TX+ and TX− before the data D is read from the memory region 100. For example, the data output circuit 200 may generate the high voltage +Vs and the low voltage −Vs at a level corresponding to the ground voltage GND during an initial period of the first bit interval AA1, thereby resetting the differential output data DOUT and DOUTB to the level corresponding to the ground voltage GND. The first to fourth Josephson junctions JJ1, JJ2, JJ3, and JJ4 included in the data output circuit 200 may be reset to the superconducting state (State X).

In this state, the memory region 100 may sequentially read out the first and second data D1 and D2 from first and second memory cells selected based on a read command and an address.

The data output circuit 200 may output the differential output data DOUT and DOUTB corresponding to the first data D1 to the data pads TX+ and TX− during the first output enable period BB1. For example, the input data control signal/TXD may be activated in response to the first data D1 having the logic low level (i.e., '0') during the first output enable period BB1, and thus the differential output data DOUT and DOUTB corresponding to the first data D1 having the logic low level ('0') may be outputted. The first to fourth Josephson junctions JJ1, JJ2, JJ3, and JJ4 included in the data output circuit 200 may have the voltage state (State Y).

The data output circuit 200 may output the differential output data DOUT and DOUTB corresponding to the second data D2 to the data pads TX+ and TX− during the second output enable period BB2. For example, the input data control signal/TXD may be deactivated in response to the second data D2 having the logic high level (i.e., '1') during the second output enable period BB2, and thus the differential output data DOUT and DOUTB corresponding to the second data D2 having the logic high level ('1') may be outputted. The first to fourth Josephson junctions JJ1, JJ2, JJ3, and JJ4 included in the data output circuit 200 may be reset to the superconducting state (State X) during the output disable period CC1, and thus maintain the superconducting state (State X).

Since the logic level (i.e., '0') of the first data D1 is different from the logic level (i.e., '1') of the second data D2, the data output circuit 200 may perform the reset operation on the data pads TX+ and TX− during the output disable period CC1. In other words, the differential output data DOUT and DOUTB may be reset to the level corresponding to the ground voltage GND during the output disable period CC1. The first to fourth Josephson junctions JJ1, JJ2, JJ3, and JJ4 included in the data output circuit 200 may be reset from the voltage state (State Y) to the superconducting state (State X) during the output disable period CC1.

Figure 8:
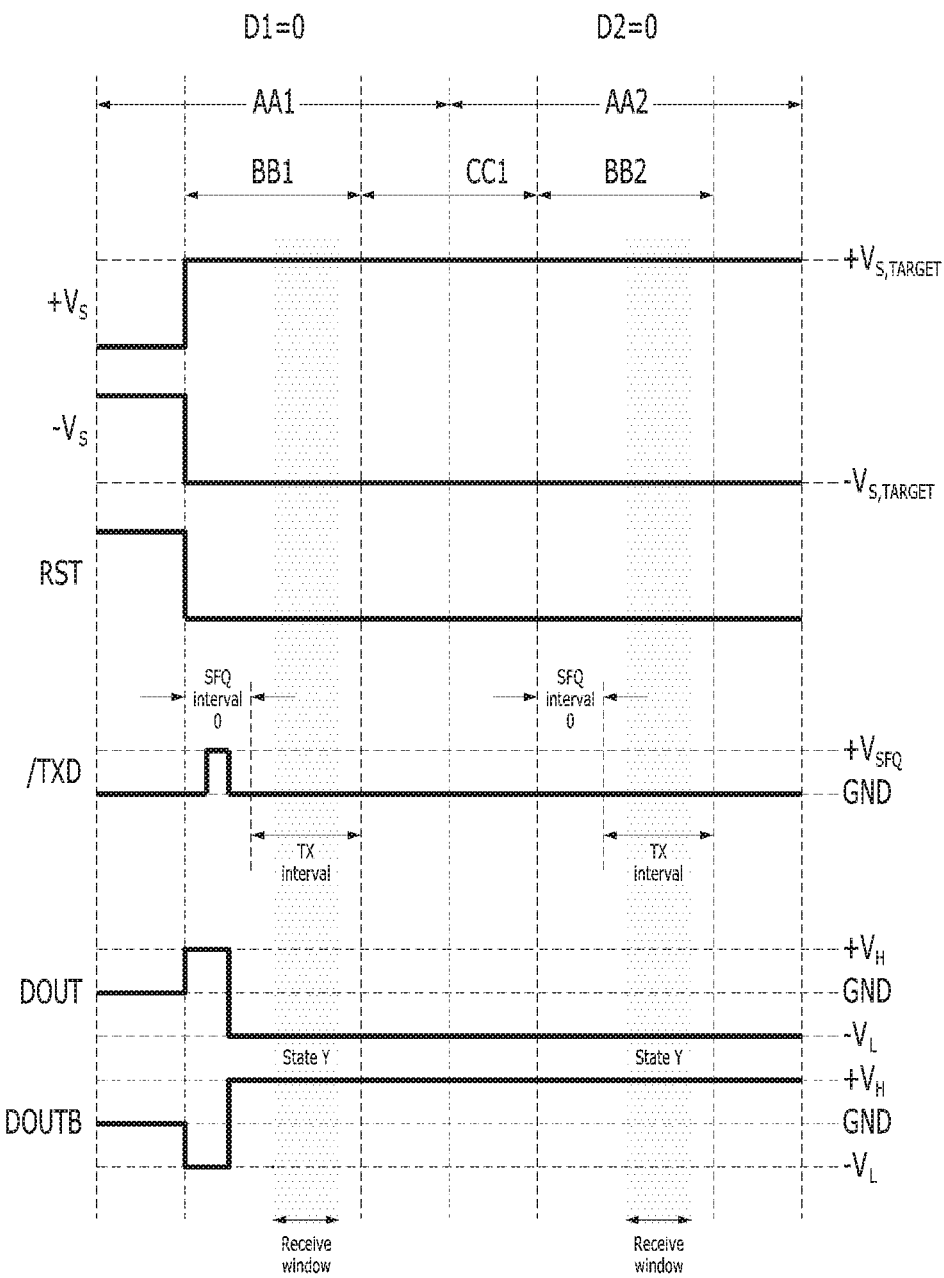

FIG. 8 is a timing diagram for describing an operation of the semiconductor memory device when the logic level of the first data D1 and the logic level of the second data D2 are '00'.

Referring to FIG. 8, the data output circuit 200 may perform the reset operation on the data pads TX+ and TX− before the data D is read from the memory region 100. For example, the data output circuit 200 may generate the high voltage +Vs and the low voltage −Vs at a level corresponding to the ground voltage GND during an initial period of the first bit interval AA1, thereby resetting the differential output data DOUT and DOUTB to the level corresponding to the ground voltage GND. The first to fourth Josephson junctions JJ1, JJ2, JJ3, and JJ4 included in the data output circuit 200 may be reset to the superconducting state (State X).

In this state, the memory region 100 may sequentially read out the first and second data D1 and D2 from first and second memory cells selected based on a read command and an address.

The data output circuit 200 may output the differential output data DOUT and DOUTB corresponding to the first data D1 to the data pads TX+ and TX− during the first output enable period BB1. For example, the input data control signal/TXD may be activated in response to the first data D1 having the logic low level (i.e., '0') during the first output enable period BB1, and thus the differential output data DOUT and DOUTB corresponding to the first data D1 having the logic low level ('0') may be outputted. The first to fourth Josephson junctions JJ1, JJ2, JJ3, and JJ4 included in the data output circuit 200 may have the voltage state (State Y).

The data output circuit 200 may output the differential output data DOUT and DOUTB corresponding to the second data D2 to the data pads TX+ and TX− during the second output enable period BB2. For example, the input data control signal/TXD may be deactivated in response to the second data D2 having the logic low level (i.e., '0') during the second output enable period BB2, and thus the differential output data DOUT and DOUTB corresponding to the second data D2 having the logic low level ('0') may be outputted. The first to fourth Josephson junctions JJ1, JJ2, JJ3, and JJ4 included in the data output circuit 200 may maintain the voltage state (State Y). For reference, the input data control signal/TXD has to be activated in response to the second data D2 having the logic low level ('0') during the second output enable period BB2. However, since the first to fourth Josephson junctions JJ1, JJ2, JJ3, and JJ4 already have the voltage state (State Y) in the first output enable period BB1, the input data control signal/TXD does not need to be activated.

Since the logic level (i.e., '0') of the first data D1 is equal to the logic level (i.e., '0') of the second data D2, the data output circuit 200 may skip the reset operation on the data pads TX+ and TX− during the output disable period CC1. In other words, the logic levels of the differential output data DOUT and DOUTB in the first output enable period BB1 may be equally maintained even in the output disable period CC1.

According to the embodiment, when the first and second data have a specific logical relationship, the semiconductor memory device may skip the reset operation on the data pads without transitioning the power supply voltage, thereby reducing power consumption. Further, when the first and second data have a specific logical relationship, the semiconductor memory device does not need to activate the input data control signal, thereby further reducing power consumption.

Figure 9:
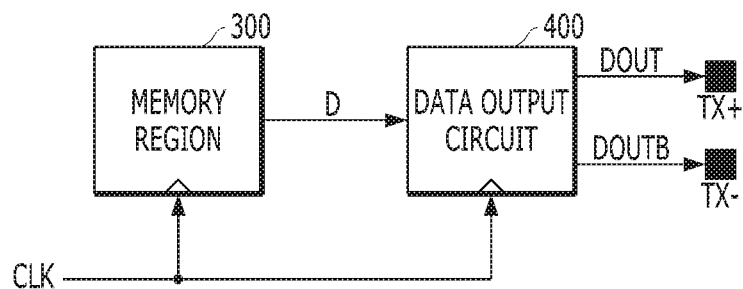
FIG. 9 is a block diagram illustrating a semiconductor memory device in accordance with an embodiment of the present invention.

FIG. 9 is a block diagram illustrating a semiconductor memory device in accordance with an embodiment of the present invention.

Referring to FIG. 9, the semiconductor memory device may include a memory region 300 and a data output circuit 400 (i.e., a cryogenic transmitter).

The memory region 300 may read data D having a predetermined burst length based on a clock signal CLK. When the burst length is set to '4', the memory region 100 may sequentially output 4-bit data D. Hereinafter, for convenience in description, it will be described as an example that 2-bit data D are sequentially outputted. The data outputted first between the 2-bit data D is referred to as "first data D1", and the data outputted next is referred to as "second data D2".

The data output circuit 400 may output differential output data DOUT and DOUTB corresponding to the data D to data pads TX+ and TX−, based on the clock signal CLK. For example, the data output circuit 400 may output first differential data corresponding to the first data D1 as the differential output data DOUT and DOUTB to the data pads TX+ and TX− during a first bit interval AA1, and then output second differential data corresponding to the second data D2 as the differential output data DOUT and DOUTB to the data pads TX+ and TX− during a second bit interval AA2.

When sequentially outputting the first and second differential data to the data pads TX+ and TX−, the data output circuit 400 may perform or skip a reset operation on the data pads TX+ and TX− during an output disable period CC1 according to a logical relationship between the first data D1 and the second data D2. The first bit interval AA1 may include a first output enable period BB1 in which the first differential data are substantially outputted, the second bit interval AA2 may include a second output enable period BB2 in which the second differential data are substantially outputted, and the output disable period CC1 may include a period between the first output enable period BB1 and the second output enable period BB2. The output disable period CC1 may include a boundary period between the first bit interval AA1 and the second bit interval AA2 (refer to FIGS. 15 to 18).

For example, the data output circuit 400 may perform the reset operation by adjusting a resistance value of a path of an internal current from a low resistance value to a high resistance value, or skip the reset operation by maintaining the resistance value of the path of the internal current as the low resistance value, according to the logical relationship between the first data D1 and the second data D2. The internal current may be an output current on which it is based when the differential output data DOUT and DOUTB are outputted, and be a current flowing through each of first to fourth Josephson junctions JJ1, JJ2, JJ3, and JJ4, which are to be described below.

Figure 10:
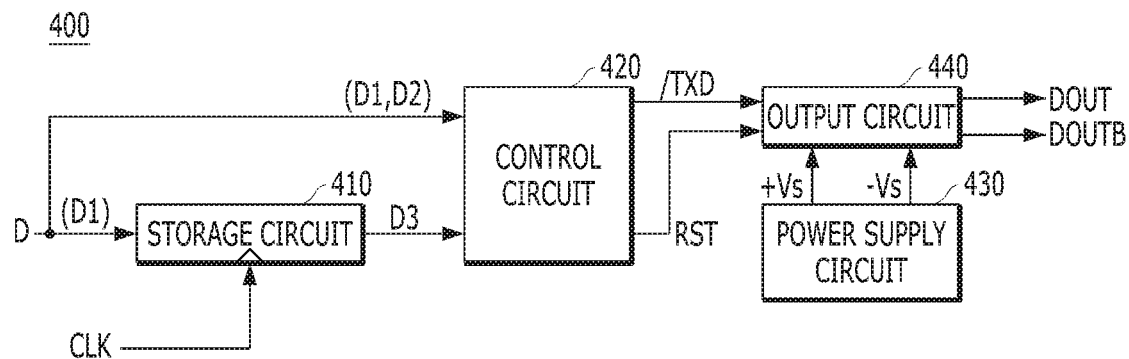
FIG. 10 is a detailed diagram of a data output circuit shown in FIG. 9.

FIG. 10 is a detailed diagram of the data output circuit 400 shown in FIG. 9.

Referring to FIG. 10, the data output circuit 400 may include a storage circuit 410, a control circuit 420, a power supply circuit 430 and an output circuit 440.

The storage circuit 410 may store the first data D1 and output the stored first data as third data D3 to the control circuit 420, based on the clock signal CLK. The third data D3 may be outputted when the second data D2 is read. In other words, the storage circuit 410 may sequentially store the first data D1 and the second data D2, and output the first data, which is stored first, as the third data D3 to the control circuit 420 when storing the second data D2 therein. A logic level of the first data D1 may be equal to a logic level of the third data D3.

The control circuit 420 may generate a reset control signal RST and an input data control signal/TXD based on the first to third data D1, D2 and D3. For example, the control circuit 420 may generate the reset control signal RST according to a logical relationship between the second data D2 and the third data D3, and generate the input data control signal/TXD based on the logical relationship and the first and second data D1 and D2. A logic level of the reset control signal RST and a logic level of the input data control signal/TXD depending on the logical relationship between the second data D2 and the third data D3 are shown in Table 2 below. Table 2 shows the logic level of the reset control signal RST in the output disable period CC1 and the logic level of the input data control signal /TXD in the second output enable period BB2 in accordance with the concept of the present invention.

TABLE 2

| D3 (=D1) | D2 | RST | /TXD |
|---|---|---|---|
| 0 | 0 | 0 | 0 |
| 0 | 1 | 1 | 0 |
| 1 | 0 | 1 | 1 |
| 1 | 1 | 0 | 0 |

Referring to Table 2, when the logic level of the third data D3 is equal to a logic level of the second data D2, the control circuit 420 may deactivate the reset control signal RST to a logic low level (e.g., '0') during the output disable period CC1. On the other hand, when the logic level of the third data D3 is different from the logic level of the second data D2, the control circuit 420 may activate the reset control signal RST to a logic high level (e.g., '1') during the output disable period CC1.

Continuously referring to Table 2, when the logic level of the third data D3 is equal to the logic level of the second data D2, the control circuit 420 may deactivate the input data control signal/TXD to the logic low level ('0') regardless of the logic level of the second data D2 during the second output enable period BB2. On the other hand, when the logic level of the third data D3 is different from the logic level of the second data D2, the control circuit 420 may determine whether to activate the input data control signal/TXD according to the second data D2 during the second output enable period BB2. For example, when the logic level of the third data D3 is different from the logic level of the second data D2, the control circuit 420 may deactivate the input data control signal/TXD to the logic low level ('0') when the second data D2 has the logic high level ('1'), and activate the input data control signal/TXD to the logic high level ('1') when the second data has the logic low level ('0').

The power supply circuit 430 may generate the high voltage +Vs and the low voltage −Vs. For example, the high voltage +Vs may have a constant positive voltage level, and the low voltage −Vs may have a constant negative voltage level. In the present embodiment, it is described as an example that the high voltage +Vs and the low voltage −Vs are generated inside the semiconductor memory device. However, the present embodiment is not limited thereto, and the high voltage +Vs and the low voltage −Vs may be provided from an external device, e.g., a controller.

The output circuit 440 may receive the high voltage +Vs and the low voltage −Vs from the power supply circuit 430. The output circuit 440 may output the differential output data DOUT and DOUTB corresponding to the first data D1 during the first output enable period BB1, and then output the differential output data DOUT and DOUTB corresponding to the second data D2 during the second output enable period BB2, in response to the reset control signal RST and the input data control signal/TXD. For example, the output circuit 440 may sequentially output the differential output data DOUT and DOUTB corresponding to the first and second data D1 and D2 by controlling the internal current based on the input data control signal/TXD during the first and second output enable periods BB1 and BB2.

In response to the reset control signal RST, the output circuit 440 may perform the reset operation on the data pads TX+ and TX− during the output disable period CC1, when the logic level of the second data D2 is different from the logic level of the third data D3. The output circuit 440 may skip the reset operation on the data pads TX+ and TX− during the output disable period CC1 when the logic level of the second data D2 is equal to the logic level of the third data D3. For example, the output circuit 440 may perform or skip the reset operation by adjusting the resistance value of the path of the internal current, in response to the reset control signal RST.

Figure 11:
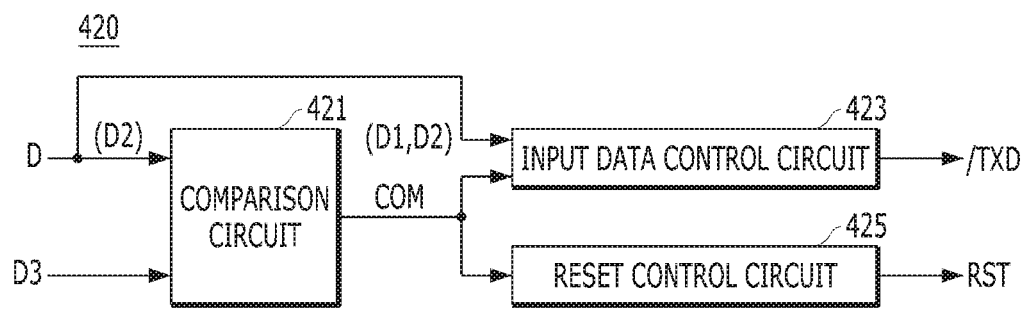
FIG. 11 is a detailed diagram of a control circuit shown in FIG. 10.

FIG. 11 is a detailed diagram of the control circuit 420 shown in FIG. 10.

Referring to FIG. 11, the control circuit 420 may include a comparison circuit 421, an input data control circuit 423 and a reset control circuit 425.

The comparison circuit 421 may compare the second data D2 with the third data D3, and generate a comparison signal COM corresponding to the comparison result. For example, the comparison circuit 421 may generate the comparison signal COM at a logic low level when the logic level of the second data D2 is equal to the logic level of the third data D3, and generate the comparison signal COM at a logic high level when the logic level of the second data D2 is different from the logic level of the third data D3.

The input data control circuit 423 may generate the input data control signal/TXD based on the first data D1, the second data D2 and the comparison signal COM. The input data control circuit 423 may determine whether to activate the input data control signal/TXD according to the first data D1 during the first output enable period BB1. For example, during the first output enable period BB1, the input data control circuit 423 may deactivate the input data control signal/TXD according to the first data D1 having the logic high level or activate the input data control signal/TXD according to the first data D1 having the logic low level. The input data control circuit 423 may whether to activate the input data control signal/TXD based on the second data D2 and the comparison signal COM during the second output enable period BB2. For example, during the second output enable period BB2, the input data control circuit 423 may deactivate the input data control signal/TXD regardless of the second data D2 when the comparison signal COM has the logic low level, deactivate the input data control signal/TXD when the comparison signal COM and the second data D2 have the logic high levels, and activate the input data control signal/TXD when the comparison signal COM has the logic high level and the second data D2 has the logic low level. The input data control circuit 423 may deactivate the input data control signal/TXD during the output disable period CC1.

The reset control circuit 425 may generate the reset control signal RST according to the comparison signal COM. For example, during the output disable period CC1, the reset control circuit 425 may deactivate the reset control signal RST according to the comparison signal COM having the logic low level, and activate the reset control signal RST according to the comparison signal COM having the logic high level. The reset control circuit 425 may deactivate the reset control signal RST during the first and second output enable periods BB1 and BB2.

Figure 12:
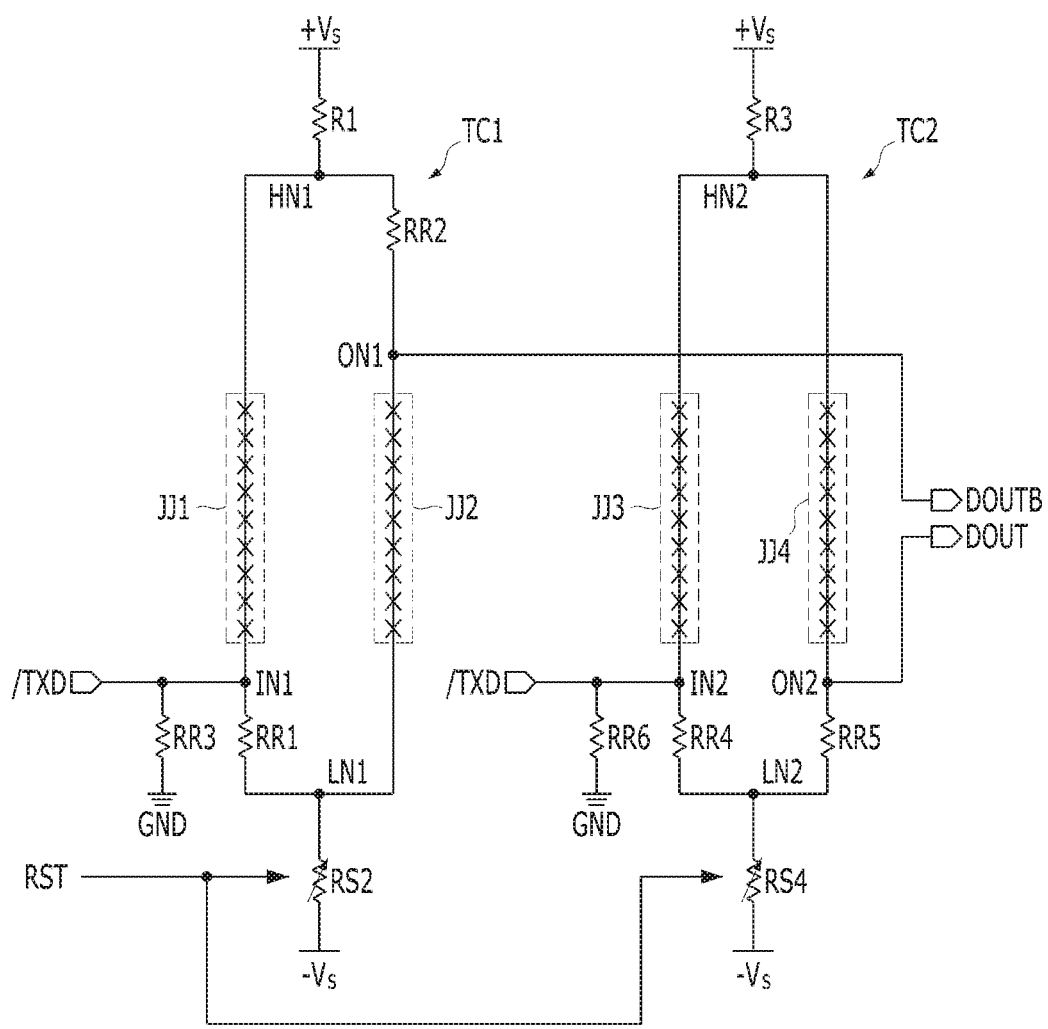
FIG. 12 is a detailed diagram illustrating an example of an output circuit shown in FIG. 10.

FIG. 12 is a detailed diagram of an example of the output circuit 440 shown in FIG. 10.

Referring to FIG. 12, the output circuit 440 may include a first resistance element R1, a first variable resistance element RS2, a first transmission circuit TC1, a second resistance element R3, a second variable resistance element RS4 and a second transmission circuit TC2.

The first resistance element R1 may be coupled between a supply terminal of the high voltage +Vs and a first high voltage supply node HN1. The first resistance element R1 may serve as a header current source.

The first variable resistance element RS2 may be coupled between a supply terminal of the low voltage −Vs and a first low voltage supply node LN1. The first variable resistance element RS1 may serve as a tail current source. For example, the first variable resistance element RS2 may have a low resistance value during the first and second output enable periods BB1 and BB2, and have a low resistance value or a high resistance value during the output disable period CC1, in response to the reset control signal RST.

The first transmission circuit TC1 may be coupled between the first high voltage supply node HN1 and the first low voltage supply node LN1. Based on the input data control signal/TXD, the first transmission circuit TC1 may generate the output data bar DOUTB of the differential output data DOUT and DOUTB corresponding to the first data D1 during the first output enable period BB1, and generate the output data bar DOUTB of the differential output data DOUT and DOUTB corresponding to the second data D2 during the second output enable period BB2. For example, the first transmission circuit TC1 may include a first input current path and a first output current path.

The first input current path may be coupled between the first high voltage supply node HN1 and the first low voltage supply node LN1. The first input current path may include a plurality of first Josephson junctions JJ1 and a fifth resistance element RR1. The plurality of first Josephson junctions JJ1 may be coupled in series between the first high voltage supply node HN1 and a first input node IN1. The first input node IN1 may be a node to which the input data control signal/TXD is inputted. The fifth resistance element RR1 may be coupled between the first input node IN1 and the first low voltage supply node LN1.

For reference, a Josephson junction may have a superconducting state (State X) or a voltage state (State Y) depending on the magnitude of a current flowing therethrough. The superconducting state (State X) refers to a state where a resistance value of the Josephson junction is 'zero' when a current equal to or less than a threshold value flows through the Josephson junction, and the voltage state (State Y) refers to a state where the resistance value of the Josephson junction is 'nonzero' when a current greater than the threshold value flows through the Josephson junction.

The first output current path may be coupled between the first high voltage supply node HN1 and the first low voltage supply node LN1. The first output current path may include a sixth resistance element RR2 and a plurality of second Josephson junctions JJ2. The sixth resistance element RR2 may be coupled between the first high voltage supply node HN1 and a first output node ON1. The first output node ON1 may be a node through which the output data bar DOUTB is outputted. The plurality of second Josephson junctions JJ2 may be coupled in series between the first output node ON1 and the first low voltage supply node LN1.

The first transmission circuit TC1 may further include a seventh resistance element RR3 coupled between the first input node IN1 and a supply terminal of a ground voltage GND.

The second resistance element R3 may be coupled between the supply terminal of the high voltage +Vs and a second high voltage supply node HN2. The second resistance element R3 may serve as the header current source.

The second variable resistance element RS4 may be coupled between the supply terminal of the low voltage −Vs and a second low voltage supply node LN2. The second variable resistance element RS4 may serve as the tail current source. For example, the second variable resistance element RS4 may have a low resistance value during the first and second output enable periods BB1 and BB2, and have a low resistance value or a high resistance value during the output disable period CC1, in response to the reset control signal RST.

The second transmission circuit TC2 may be coupled between the second high voltage supply node HN2 and the second low voltage supply node LN2. The second transmission circuit TC2 may generate the output data DOUT of the differential output data DOUT and DOUTB corresponding to the first data D1 during the first output enable period BB1, and generate the output data DOUTB of the differential output data DOUT and DOUTB corresponding to the second data D2 during the second output enable period BB2, based on the input data control signal/TXD. The second transmission circuit TC2 may include a second input current path and a second output current path.

The second input current path may be coupled between the second high voltage supply node HN2 and the second low voltage supply node LN2. The second input current path may include a plurality of third Josephson junctions JJ3 and an eighth resistance element RR4. The plurality of third Josephson junctions JJ3 may be coupled in series between the second high voltage supply node HN2 and a second input node IN2. The second input node IN2 may be a node to which the input data control signal/TXD is inputted. The eighth resistance element RR4 may be coupled between the second input node IN2 and the second low voltage supply node LN2.

The second output current path may be coupled between the second high voltage supply node HN2 and the second low voltage supply node LN2. The second output current path may include a plurality of fourth Josephson junctions JJ4 and a ninth resistance element RR5. The plurality of fourth Josephson junctions JJ4 may be coupled in series between the second high voltage supply node HN2 and a second output node ON2. The second output node ON2 may be a node through which the output data DOUT is outputted. The ninth resistance element RR5 may be coupled between the second output node ON2 and the second low voltage supply node LN2.

The second transmission circuit TC2 may further include a $10^{th}$ resistance element RR6 coupled between the second input node IN2 and the supply terminal of the ground voltage GND.

Figure 13:
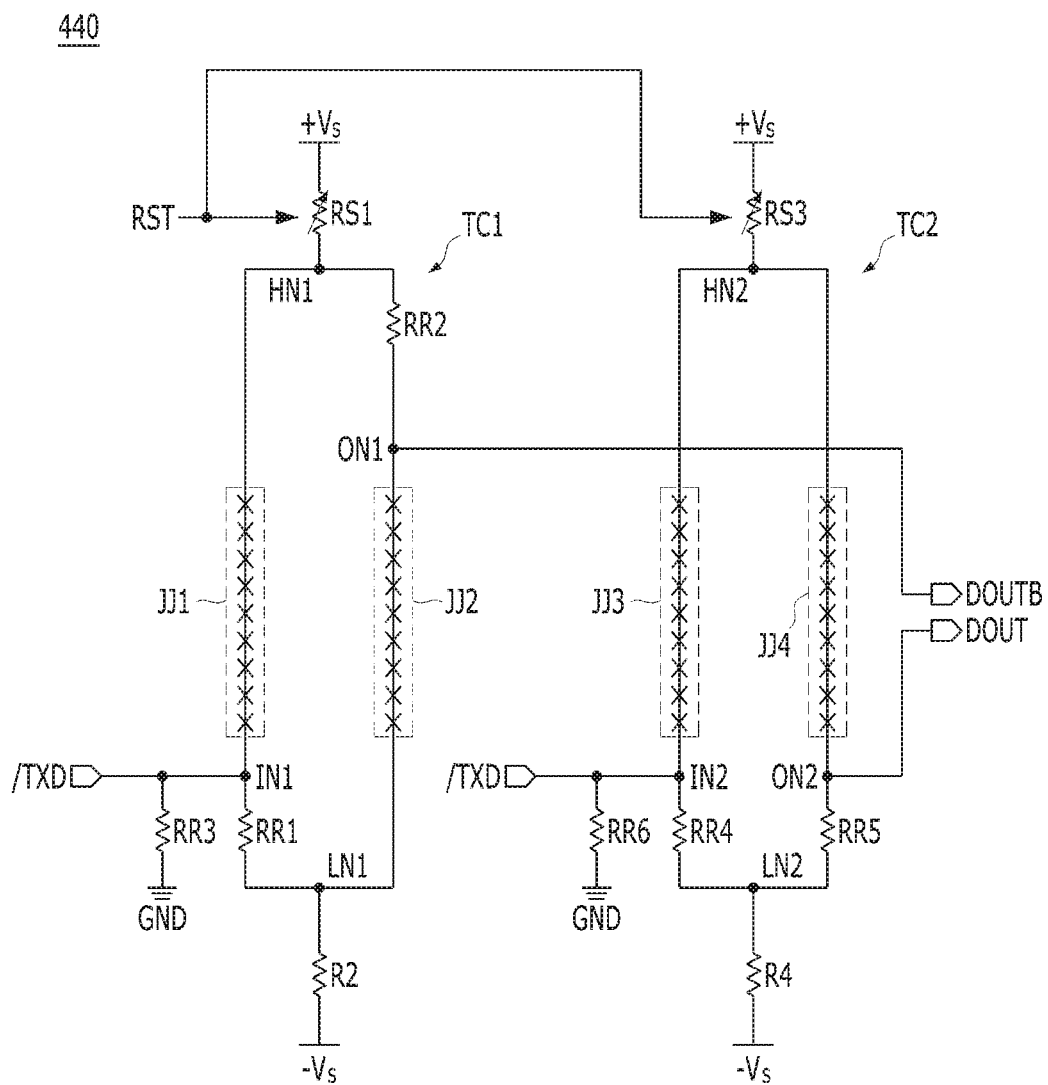
FIG. 13 is a detailed diagram illustrating another example of the output circuit shown in FIG. 10.

FIG. 13 is a detailed diagram of another example of then output circuit 440 shown in FIG. 10.

Referring to FIG. 13, the output circuit 440 may include a first variable resistance element RS1, a first resistance element R2, a first transmission circuit TC1, a second variable resistance element RS3, a second resistance element R4 and a second transmission circuit TC2.

Since the first and second transmission circuits TC1 and TC2 included in the output circuit 440 are the same as those of FIG. 12, detailed descriptions thereof will be omitted.

The first variable resistance element RS1 may be coupled between a supply terminal of the high voltage +Vs and a first high voltage supply node HN1. The first variable resistance element RS1 may serve as a header current source. For example, the first variable resistance element RS1 may have a low resistance value during the first and second output enable periods BB1 and BB2, and have a low resistance value or a high resistance value during the output disable period CC1, in response to the reset control signal RST.

The first resistance element R2 may be coupled between a supply terminal of the low voltage −Vs and a first low voltage supply node LN1. The first resistance element R2 may serve as a tail current source.

The second variable resistance element RS3 may be coupled between the supply terminal of the high voltage +Vs and a second high voltage supply node HN2. The second variable resistance element RS3 may serve as the header current source. For example, the second variable resistance element RS3 may have a low resistance value during the first and second output enable periods BB1 and BB2, and have a low resistance value or a high resistance value during the output disable period CC1, in response to the reset control signal RST.

The second resistance element R3 may be coupled between the supply terminal of the low voltage −Vs and a second low voltage supply node LN2. The second resistance element R4 may serve as the tail current source.

Figure 14:
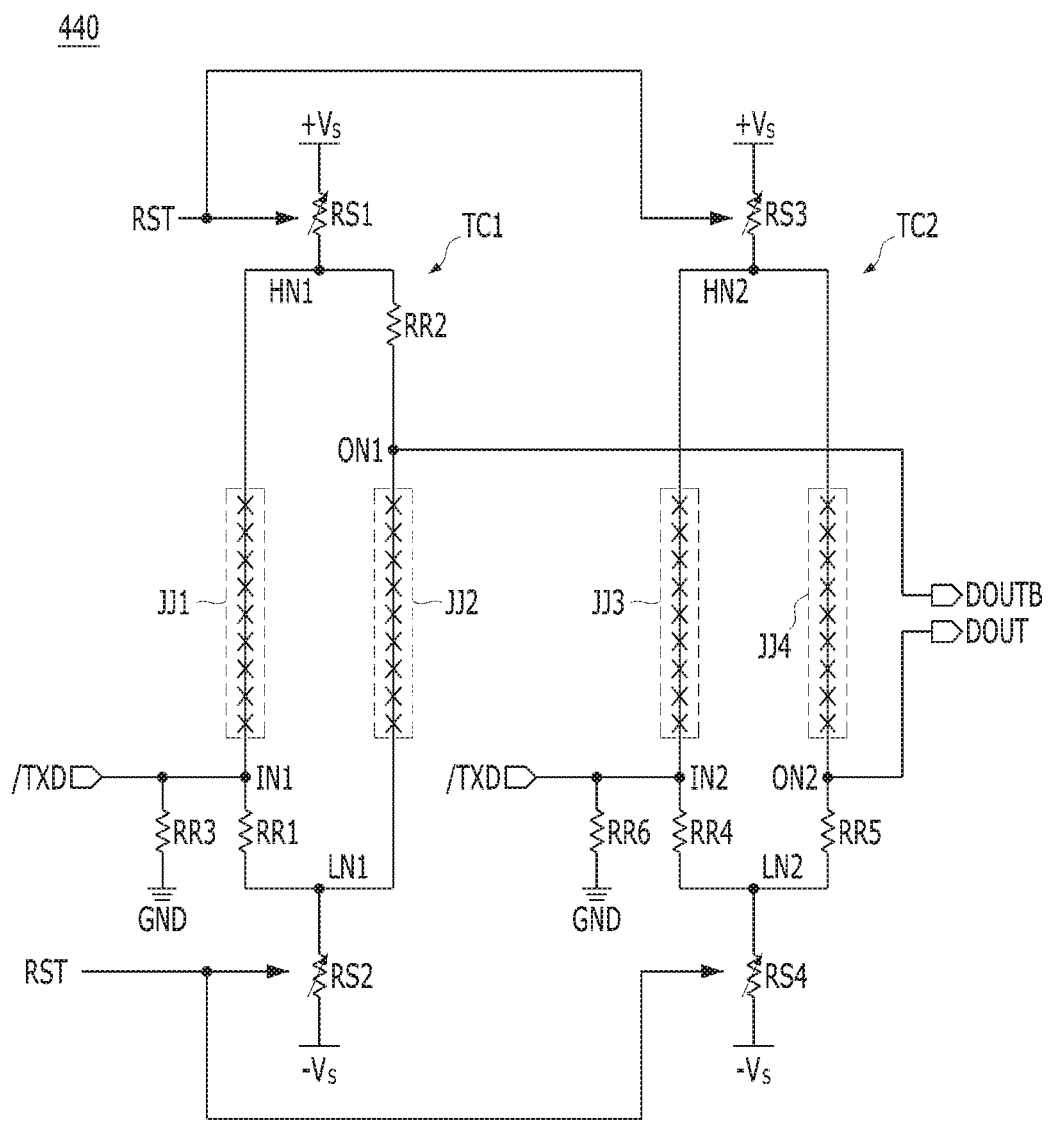
FIG. 14 is a detailed diagram illustrating yet another example of the output circuit shown in FIG. 10.

FIG. 14 is a detailed diagram of yet another example of the output circuit 440 shown in FIG. 10.

Referring to FIG. 14, the output circuit 440 may include a first variable resistance element RS1, a second variable resistance element RS2, a first transmission circuit TC1, a third variable resistance element RS3, a fourth variable resistance element RS4 and a second transmission circuit TC2. Each of the variable resistance element RS1 to RS4 may be embodied with an NMOS transistor.

Since the first and second transmission circuits TC1 and TC2 included in the output circuit 440 are the same as those of FIG. 12, detailed descriptions thereof will be omitted.

The first variable resistance element RS1 may be coupled between a supply terminal of the high voltage +Vs and a first high voltage supply node HN1. The first variable resistance element RS1 may serve as a header current source. For example, the first variable resistance element RS1 may have a low resistance value during the first and second output enable periods BB1 and BB2, and have a low resistance value or a high resistance value during the output disable period CC1, in response to the reset control signal RST.

The second variable resistance element RS2 may be coupled between a supply terminal of the low voltage −Vs and a first low voltage supply node LN1. The second variable resistance element RS2 may serve as a tail current source. For example, the second variable resistance element RS2 may have a low resistance value during the first and second output enable periods BB1 and BB2, and have a low resistance value or a high resistance value during the output disable period CC1, in response to the reset control signal RST.

The third variable resistance element RS3 may be coupled between the supply terminal of the high voltage +Vs and a second high voltage supply node HN2. The third variable resistance element RS3 may serve as the header current source. For example, the third variable resistance element RS3 may have a low resistance value during the first and second output enable periods BB1 and BB2, and have a low resistance value or a high resistance value during the output disable period CC1, in response to the reset control signal RST.

The fourth resistance element RS4 may be coupled between the supply terminal of the low voltage −Vs and a second low voltage supply node LN2. The fourth resistance element RS4 may serve as the tail current source. For example, the fourth resistance element RS4 may have a low resistance value during the first and second output enable periods BB1 and BB2, and have a low resistance value or a high resistance value during the output disable period CC1, in response to the reset control signal RST.

Hereinafter, an operation of the semiconductor memory device having the above-described structure will be described with reference to FIGS. 15 to 18. For convenience in description, the operation of the semiconductor memory device including the output circuit 440 shown in FIG. 12 will be representatively described.

Reference numerals of which each is applied as the same representation in FIGS. 15 to 18 are described in advance. The first and second bit intervals AA1 and AA2 refer to time required for transmitting the first and second data D1 and D2, respectively. The first and second bit intervals AA1 and AA2 may be continuous to each other. The first bit interval AA1 may include the first output enable period BB1. The first output enable period BB1 may include the minimum amount of time for a receiver (not illustrated) to receive one-bit data, i.e., a receive window. The second bit interval AA2 may include the second output enable period BB2. The second output enable period BB2 may include the minimum of time for the receiver to receive one-bit data, i.e., a receive window. The output disable period CC1 may be included between the first output enable period BB1 and the second output enable period BB2. The output disable period CC1 refers to a period in which the reset operation on the data pads TX+ and TX− is performed or skipped. The first output enable period BB1, the output disable period CC1 and the second output enable period BB2 may be continuous to one another.

Figure 15:
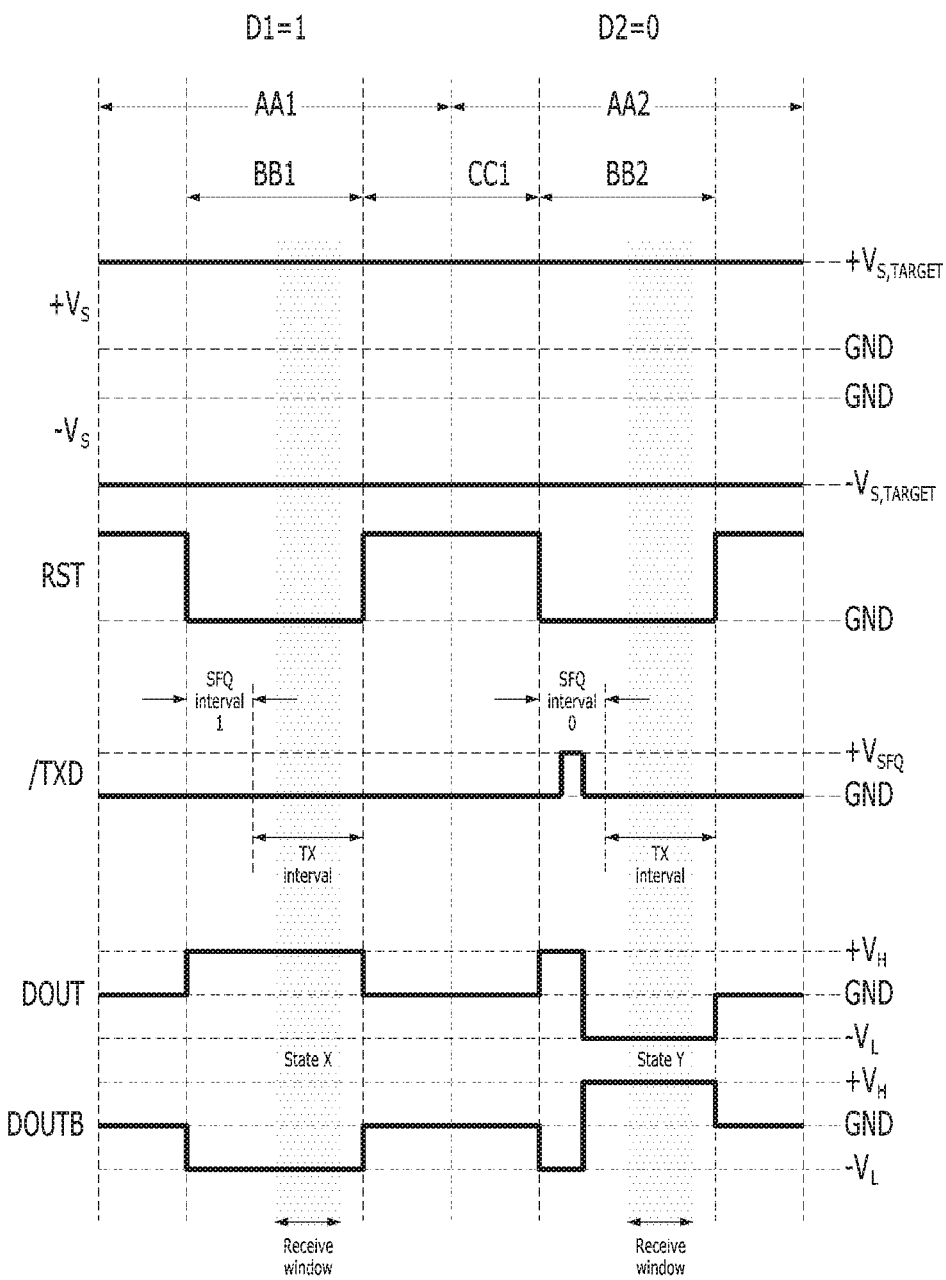
FIGS. 15 to 18 are timing diagrams for describing operations of the semiconductor memory device shown in FIG. 9.

FIG. 15 is a timing diagram for describing an operation of the semiconductor memory device when the logic level of the first data D1 and the logic level of the second data D2 are '10'.

Referring to FIG. 15, the power supply circuit 430 may constantly supply the output circuit 440 with the high voltage +Vs and the low voltage −Vs at respective predetermined levels (i.e., target levels; '+$V_{S,TARGET}$' and '+$V_{S,TARGET}$'). The data output circuit 400 may perform an output operation using the high voltage +Vs and the low voltage −Vs.

The data output circuit 400 may perform the reset operation on the data pads TX+ and TX− before the data D is read from the memory region 300. For example, the data output circuit 400 may generate the high voltage +Vs and the low voltage −Vs at a level corresponding to the ground voltage GND during an initial period of the first bit interval AA1, thereby resetting the differential output data DOUT and DOUTB to the level corresponding to the ground voltage GND. The first and second variable resistance elements RS1 and RS2 may have high resistance values based on the activated reset control signal RST. Accordingly, as an internal current equal to or lower than a threshold value flows through the first and second transmission circuits TC1 and TC2, the first to fourth Josephson junctions JJ1, JJ2, JJ3 and JJ4 may be reset to the superconducting state (State X).

In this state, the memory region 300 may sequentially read out the first and second data D1 and D2 from first and second memory cells selected based on a read command and an address.

The data output circuit 400 may output the differential output data DOUT and DOUTB corresponding to the first data D1 to the data pads TX+ and TX− during the first output enable period BB1. For example, the input data control signal/TXD may be deactivated in response to the first data D1 having the logic high level (i.e., '1') during the first output enable period BB1, and thus the differential output data DOUT and DOUTB corresponding to the first data D1 having the logic high level ('1') may be outputted. The first and second variable resistance elements RS1 and RS2 may have low resistance values based on the deactivated reset control signal RST, and the input data control signal/TXD may be deactivated. Accordingly, the first to fourth Josephson junctions 31, JJ2, JJ3, and JJ4 may maintain the superconducting state (State X).

The data output circuit 400 may output the differential output data DOUT and DOUTB corresponding to the second data D2 to the data pads TX+ and TX− during the second output enable period BB2. For example, the input data control signal/TXD may be activated in response to the second data D2 having the logic low level (i.e., '0') during the second output enable period BB2, and thus the differential output data DOUT and DOUTB corresponding to the second data D2 having the logic low level ('0') may be outputted. The first and second variable resistance elements RS1 and RS2 may have low resistance values based on the deactivated reset control signal RST, and the input data control signal/TXD may be activated. Accordingly, as an internal current equal to or higher than the threshold value flows through the first and second transmission circuits TC1 and TC2, the first to fourth Josephson junctions JJ1, JJ2, JJ3, and JJ4 may have the voltage state (State Y).

Since the logic level (i.e., '1') of the first data D1 is different from the logic level (i.e., '0') of the second data D2, the data output circuit 400 may perform the reset operation on the data pads TX+ and TX− during the output disable period CC1. In other words, the differential output data DOUT and DOUTB may be reset to the level corresponding to the ground voltage GND during the output disable period CC1. The first and second variable resistance elements RS1 and RS2 may have high resistance values based on the activated reset control signal RST. Accordingly, as an internal current lower than the threshold value flows through the first and second transmission circuits TC1 and TC2, the first to fourth Josephson junctions JJ1, JJ2, JJ3, and JJ4 may be reset to the superconducting state (State X).

Figure 16:
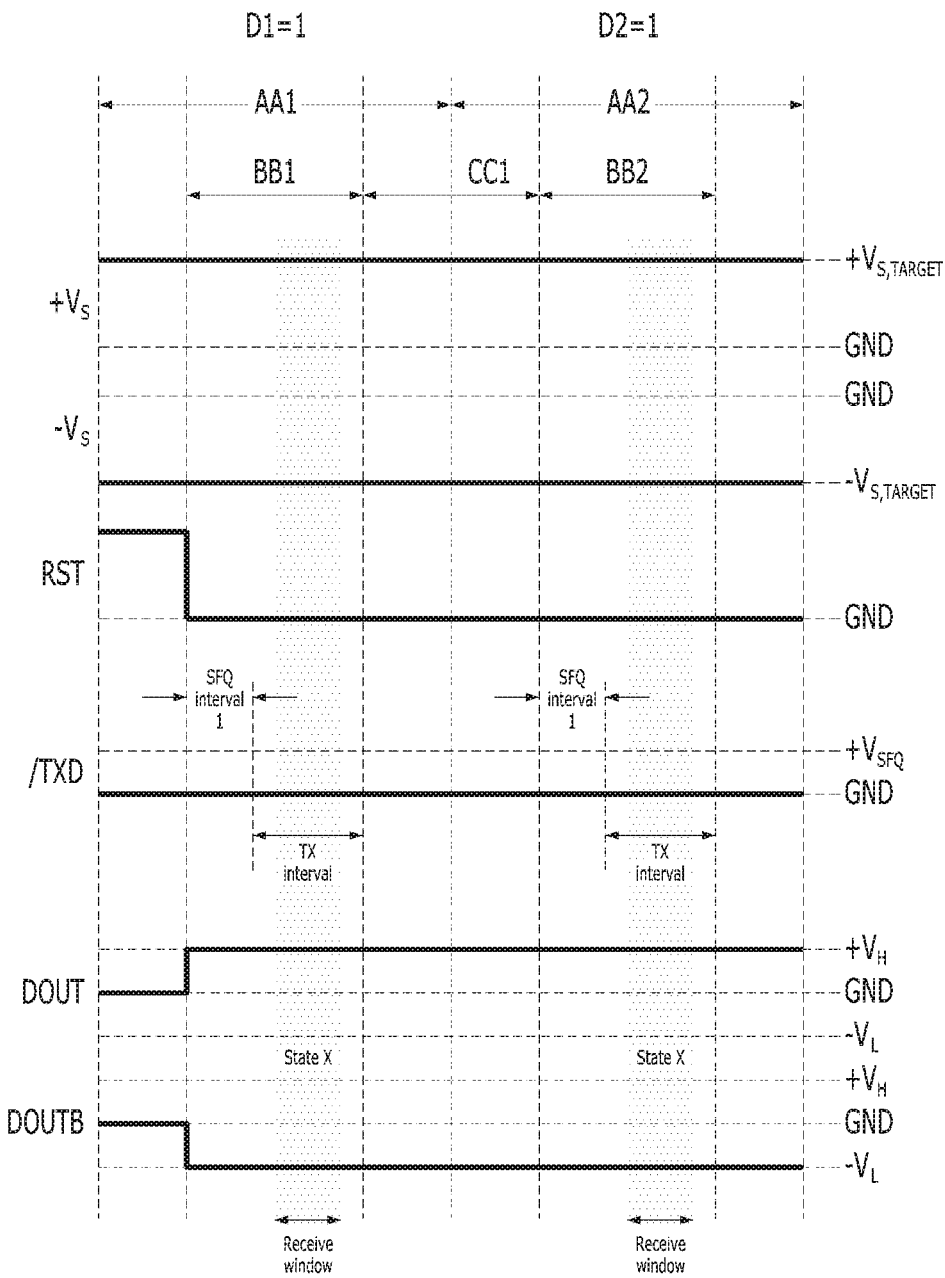

FIG. 16 is a timing diagram for describing an operation of the semiconductor memory device when the logic level of the first data D1 and the logic level of the second data D2 are '11'.

Referring to FIG. 16, the power supply circuit 430 may constantly supply the output circuit 440 with the high voltage +Vs and the low voltage −Vs at respective predetermined levels. The data output circuit 400 may perform an output operation using the high voltage +Vs and the low voltage −Vs.

The data output circuit 400 may perform the reset operation on the data pads TX+ and TX− before the data D is read from the memory region 300. For example, the data output circuit 400 may generate the high voltage +Vs and the low voltage −Vs at a level corresponding to the ground voltage GND during an initial period of the first bit interval AA1, thereby resetting the differential output data DOUT and DOUTB to the level corresponding to the ground voltage GND. The first and second variable resistance elements RS1 and RS2 may have high resistance values based on the activated reset control signal RST. Accordingly, as an internal current equal to or lower than a threshold value flows through the first and second transmission circuits TC1 and TC2, the first to fourth Josephson junctions 111, JJ2, JJ3 and JJ4 may be reset to the superconducting state (State X).

In this state, the memory region 300 may sequentially read out the first and second data D1 and D2 from first and second memory cells selected based on a read command and an address.

The data output circuit 400 may output the differential output data DOUT and DOUTB corresponding to the first data D1 to the data pads TX+ and TX− during the first output enable period BB1. For example, the input data control signal/TXD may be deactivated in response to the first data D1 having the logic high level (i.e., '1') during the first output enable period BB1, and thus the differential output data DOUT and DOUTB corresponding to the first data D1 having the logic high level ('1') may be outputted. The first and second variable resistance elements RS1 and RS2 may have low resistance values based on the deactivated reset control signal RST, and the input data control signal/TXD may be deactivated. Accordingly, the first to fourth Josephson junctions JJ1, JJ2, JJ3, and JJ4 may maintain the superconducting state (State X).

The data output circuit 400 may output the differential output data DOUT and DOUTB corresponding to the second data D2 to the data pads TX+ and TX− during the second output enable period BB2. For example, the input data control signal/TXD may be deactivated in response to the second data D2 having the logic high level (i.e., '1') during the second output enable period BB2, and thus the differential output data DOUT and DOUTB corresponding to the second data D2 having the logic high level ('1') may be outputted. The first and second variable resistance elements RS1 and RS2 may maintain low resistance values based on the deactivated reset control signal RST, and the input data control signal/TXD may be deactivated. Accordingly, the first to fourth Josephson junctions JJ1, JJ2, JJ3, and JJ4 may maintain the superconducting state (State X).

Since the logic level (i.e., '1') of the first data D1 is equal to the logic level (i.e., '1') of the second data D2, the data output circuit 400 may skip the reset operation on the data pads TX+ and TX− during the output disable period CC1. In other words, the voltage levels of the differential output data DOUT and DOUTB in the first output enable period BB1 may be equally maintained even in the output disable period CC1.

Figure 17:
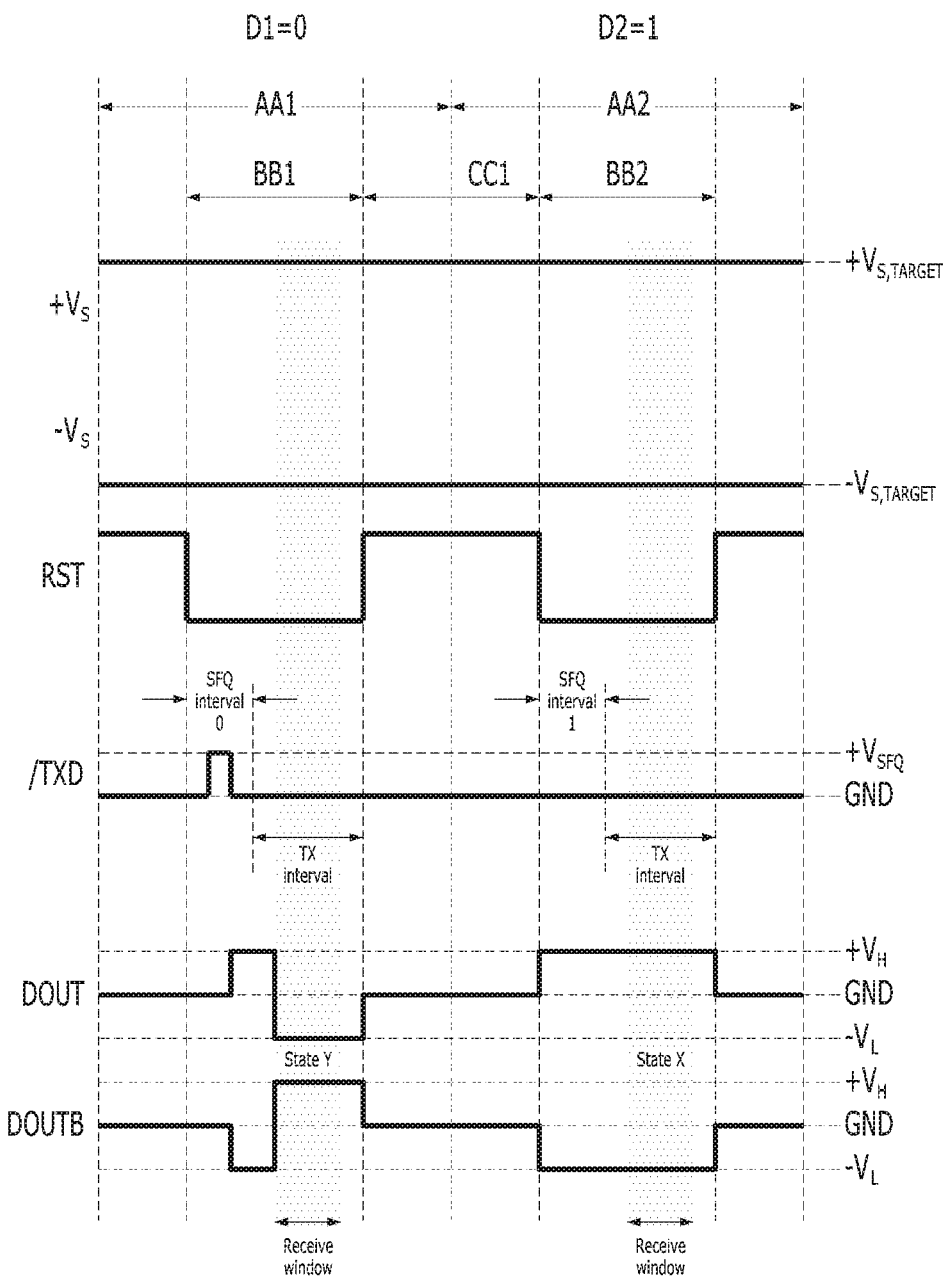

FIG. 17 is a timing diagram for describing an operation of the semiconductor memory device when the logic level of the first data D1 and the logic level of the second data D2 are '01'.

Referring to FIG. 17, the power supply circuit 430 may constantly supply the output circuit 440 with the high voltage +Vs and the low voltage −Vs at respective predetermined levels. The data output circuit 400 may perform an output operation using the high voltage +Vs and the low voltage −Vs.

The data output circuit 400 may perform the reset operation on the data pads TX+ and TX− before the data D is read from the memory region 300. For example, the data output circuit 400 may generate the high voltage +Vs and the low voltage −Vs at a level corresponding to the ground voltage GND during an initial period of the first bit interval AA1, thereby resetting the differential output data DOUT and DOUTB to the level corresponding to the ground voltage GND. The first and second variable resistance elements RS1 and RS2 may have high resistance values based on the activated reset control signal RST. Accordingly, as an internal current equal to or lower than a threshold value flows through the first and second transmission circuits TC1 and TC2, the first to fourth Josephson junctions JJ1, JJ2, JJ3, and JJ4 may be reset to the superconducting state (State X).

In this state, the memory region 300 may sequentially read out the first and second data D1 and D2 from first and second memory cells selected based on a read command and an address.

The data output circuit 400 may output the differential output data DOUT and DOUTB corresponding to the first data D1 to the data pads TX+ and TX− during the first output enable period BB1. For example, the input data control signal/TXD may be activated in response to the first data D1 having the logic low level (i.e., '0') during the first output enable period BB1, and thus the differential output data DOUT and DOUTB corresponding to the first data D1 having the logic low level ('0') may be outputted. The first and second variable resistance elements RS1 and RS2 may have low resistance values based on the deactivated reset control signal RST, and the input data control signal/TXD may be activated. Accordingly, as an internal current equal to or higher than the threshold value flows through the first and second transmission circuits TC1 and TC2, the first to fourth Josephson junctions JJ1, JJ2, JJ3, and JJ4 may have the voltage state (State Y).

The data output circuit 400 may output the differential output data DOUT and DOUTB corresponding to the second data D2 to the data pads TX+ and TX− during the second output enable period BB2. For example, the input data control signal/TXD may be activated in response to the second data D2 having the logic high level (i.e., '1') during the second output enable period BB2, and thus the differential output data DOUT and DOUTB corresponding to the second data D2 having the logic high level ('1') may outputted. The first and second variable resistance elements RS1 and RS2 may have low resistance values based on the deactivated reset control signal RST, and the input data control signal/TXD may be deactivated. Accordingly, the first to fourth Josephson junctions JJ1, JJ2, JJ3, and JJ4 may be reset to the superconducting state (State X) during the output disable period CC1, and thus maintain the superconducting state (State X) during the second output enable period BB2.

Since the logic level (i.e., '0') of the first data D1 is different from the logic level (i.e., '1') of the second data D2, the data output circuit 400 may perform the reset operation on the data pads TX+ and TX− during the output disable period CC1. In other words, the differential output data DOUT and DOUTB may be reset to the level corresponding to the ground voltage GND during the output disable period CC1. The first and second variable resistance elements RS1 and RS2 may have high resistance values based on the activated reset control signal RST. Accordingly, as an internal current equal to or lower than the threshold value flows through the first and second transmission circuits TC1 and TC2, the first to fourth Josephson junctions JJ1, JJ2, JJ3, and JJ4 may be reset to the superconducting state (State X).

Figure 18:
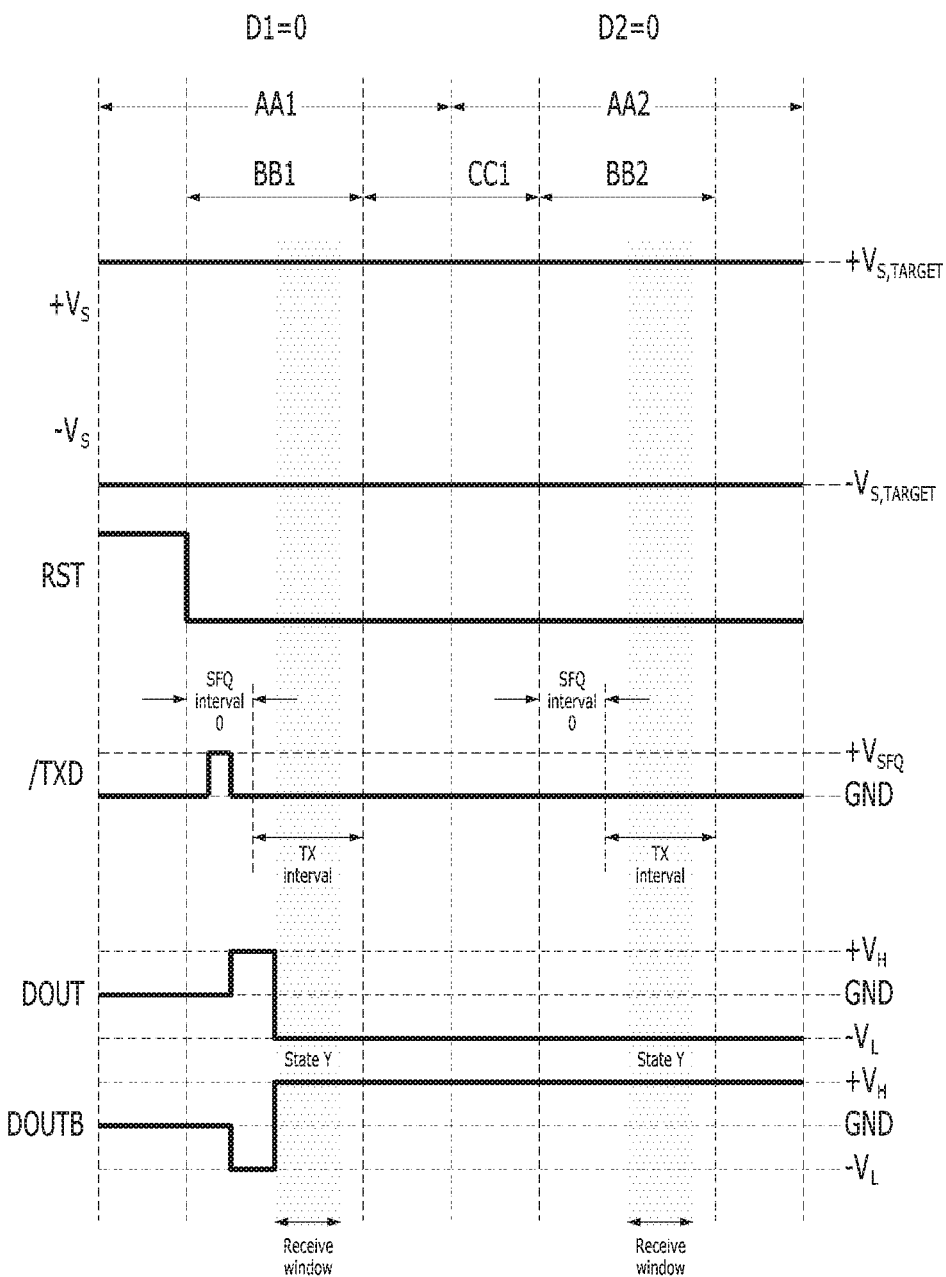

FIG. 18 is a timing diagram for describing an operation of the semiconductor memory device when the logic level of the first data D1 and the logic level of the second data D2 are '00'.

Referring to FIG. 18, the power supply circuit 430 may constantly supply the output circuit 440 with the high voltage +Vs and the low voltage −Vs at respective predetermined levels. The data output circuit 400 may perform an output operation using the high voltage +Vs and the low voltage −Vs.

The data output circuit 400 may perform the reset operation on the data pads TX+ and TX− before the data D is read from the memory region 100. For example, the data output circuit 400 may generate the high voltage +Vs and the low voltage −Vs at a level corresponding to the ground voltage GND during an initial period of the first bit interval AA1, thereby resetting the differential output data DOUT and DOUTB to the level corresponding to the ground voltage GND. The first and second variable resistance elements RS1 and RS2 may have high resistance values based on the activated reset control signal RST. Accordingly, as an internal current equal to or lower than a threshold value flows through the first and second transmission circuits TC1 and TC2, the first to fourth Josephson junctions JJ1, JJ2, JJ3, and JJ4 may be reset to the superconducting state (State X).

In this state, the memory region 300 may sequentially read out the first and second data D1 and D2 from first and second memory cells selected based on a read command and an address.

The data output circuit 400 may output the differential output data DOUT and DOUTB corresponding to the first data D1 to the data pads TX+ and TX− during the first output enable period BB1. For example, the input data control signal/TXD may be activated in response to the first data D1 having the logic low level (i.e., '0') during the first output enable period BB1, and thus the differential output data DOUT and DOUTB corresponding to the first data D1 having the logic low level ('0') may be outputted. The first and second variable resistance elements RS1 and RS2 may have low resistance values based on the deactivated reset control signal RST, and the input data control signal/TXD may be activated. Accordingly, as an internal current higher than the threshold value flows through the first and second transmission circuits TC1 and TC2, the first to fourth Josephson junctions JJ1, JJ2, JJ3, and JJ4 may have the voltage state (State Y).

The data output circuit 400 may output the differential output data DOUT and DOUTB corresponding to the second data D2 to the data pads TX+ and TX− during the second output enable period BB2. For example, the input data control signal/TXD may be deactivated in response to the second data D2 having the logic low level (i.e., '0') during the second output enable period BB2, and thus the differential output data DOUT and DOUTB corresponding to the second data D2 having the logic low level ('0') may be outputted. The first and second variable resistance elements RS1 and RS2 may have low resistance values based on the deactivated reset control signal RST, and the first to fourth Josephson junctions JJ1, JJ2, JJ3, and JJ4 included in the data output circuit 400 may maintain the voltage state (State Y). The input data control signal/TXD has to be activated in response to the second data D2 having the logic low level ('0') during the second output enable period BB2. However, since the first to fourth Josephson junctions JJ1, JJ2, JJ3, and JJ4 already have the voltage state (State Y) in the first output enable period BB1, the input data control signal/TXD does not need to be activated.

Since the logic level (i.e., '0') of the first data D1 is equal to the logic level (i.e., '0') of the second data D2, the data output circuit 400 may skip the reset operation on the data pads TX+ and TX− during the output disable period CC1. In other words, the voltage levels of the differential output data DOUT and DOUTB in the first output enable period BB1 may be equally maintained even in the output disable period CC1.

According to the embodiment, when the first and second data have a specific logical relationship, the semiconductor memory device may skip the reset operation on the data pads without transitioning the power supply voltage, thereby reducing power consumption.

Further, when the first and second data have a specific logical relationship, the semiconductor memory device does not need to activate the input data control signal, thereby further reducing power consumption. In addition, the semiconductor memory device may change the resistance value without changing the power supply voltage, thereby reducing time and power required when the power supply voltage is changed.

As is apparent from the above descriptions, the semiconductor memory device in accordance with the embodiments can transmit signals at low power and high speed.

While the present invention has been illustrated and described with respect to specific embodiments, the disclosed embodiments are not intended to be restrictive. Further, it is noted that the present invention may be achieved in various ways through substitution, change, and modification, as those skilled in the art will recognize in light of the present disclosure, without departing from the spirit and/or scope of the present disclosure. The present invention is intended to embrace all such substitutions, changes and modifications that fall within the scope of the following claims. For example, although a transmitter is described as a differential type, the present invention may apply to a single ended transmitter.

What is claimed is:

1. A semiconductor memory device comprising:
   a memory region from which first data and second data are sequentially read; and
   a data output circuit including a storage circuit, a control circuit, and an input data control circuit, the data output circuit being suitable for selectively performing a reset operation on a data pad during an output disable period between a first output enable period corresponding to first output data and a second output enable period corresponding to second output data, when sequentially outputting the first and second output data corresponding to the first and second data through the data pad,
   wherein the storage circuit is suitable for storing the first data and outputting the stored first data as third data when the second data is read,
   wherein the control circuit is suitable for generating a reset control signal and an input data control signal based on the first data and the second data;
   wherein the control circuit determines whether to activate the input data control signal according to the first data during the first output enable period,
   wherein the control circuit deactivates the input data control signal regardless of the second data during the second output enable period when a logic level of the second data is equal to a logic level of the third data, and determines whether to activate the input data control signal according to the second data during the second output enable period when the logic level of the second data is different from the logic level of the third data, and
   wherein the control circuit deactivates the input data control circuit during the output disable period.

2. The semiconductor memory device of claim 1, wherein the data output circuit performs the reset operation by transitioning a power supply voltage from a target level to a reset level during the output disable period or skips the reset operation by maintaining the power supply voltage at the target level during the output disable period, and
   the power supply voltage includes a voltage used when the first and second output data are outputted, and has the target level during the first output enable period and the second output enable period.

3. The semiconductor memory device of claim 1, wherein the data output circuit performs the reset operation by adjusting a resistance value of a path of an internal current from a low resistance value to a high resistance value during the output disable period or skips the reset operation by maintaining the resistance value of the path of the internal current as the low resistance value during the output disable period,
   the internal current includes an output current which becomes a basis when the first and second output data are outputted, and
   the resistance value of the path of the internal current has the low resistance value during the first output enable period and the second output enable period.

4. A semiconductor memory device comprising:
   a memory region from which first data and second data are sequentially read;
   a storage circuit suitable for storing the first data and outputting the stored first data as third data when the second data is read;
   a control circuit suitable for generating a reset control signal and an input data control signal based on the first to third data;
   a power supply circuit suitable for generating a high voltage and a low voltage each having a target level during a first output enable period and a second output enable period, in response to the reset control signal, and transitioning each of the high and low voltages from the target level to a reset level or maintaining each of the high and low voltages at the target level, according to a logical relationship between the second data and the third data during an output disable period between the first output enable period and the second output enable period; and
   an output circuit suitable for receiving the high and low voltages, and outputting first output data corresponding to the first data to a data pad during the first output enable period and outputting second output data corresponding to the second data to the data pad during the second output enable period, based on the input data control signal,
   wherein the control circuit determines whether to activate the input data control signal according to the first data during the first output enable period,
   wherein the control circuit deactivates the input data control signal regardless of the second data during the second output enable period when a logic level of the second data is equal to a logic level of the third data, and determines whether to activate the input data control signal according to the second data during the second output enable period when the logic level of the second data is different from the logic level of the third data, and
   wherein the control circuit deactivates an input data control circuit during the output disable period.

5. The semiconductor memory device of claim 4, wherein the power supply circuit maintains each of the high and low voltages at the target level when a logic level of the second data is equal to a logic level of the third data, and
   the output circuit skips a reset operation on the data pad during the output disable period when the logic level of the second data is equal to the logic level of the third data.

6. The semiconductor memory device of claim 4, wherein the power supply circuit transitions each of the high and low voltages from the target level to the reset level when a logic level of the second data is different from a logic level of the third data, and
   the output circuit performs a reset operation on the data pad during the output disable period when the logic level of the second data is different from the logic level of the third data.

7. The semiconductor memory device of claim 4,
   wherein the control circuit deactivates the reset control signal during the first and second output enable periods,
   wherein the control circuit deactivates the reset control signal when a logic level of the second data is equal to a logic level of the third data, and activates the reset control signal when the logic level of the second data is different from the logic level of the third data, during the output disable period.

8. The semiconductor memory device of claim 4, wherein the control circuit includes:
   a comparison circuit suitable for comparing the second data with the third data, and generating a comparison signal corresponding to the comparison result;

the input data control circuit suitable for generating the input data control signal based on the first and second data and the comparison signal; and a reset control circuit suitable for generating the reset control signal according to the comparison signal.

9. The semiconductor memory device of claim 4, wherein the output circuit includes one or more Josephson junctions.

10. A semiconductor memory device comprising:

a memory region from which first data and second data are sequentially read;

a storage circuit suitable for storing the first data and outputting the stored first data as third data when the second data is read;

a control circuit suitable for generating a reset control signal and an input data control signal based on the first to third data;

a power supply circuit suitable for generating a high voltage and a low voltage each having a constant voltage level; and an output circuit suitable for receiving the high and low voltages, and sequentially outputting first output data and second output data corresponding to the first data and the second data, respectively, to a data pad by controlling an internal current during a first output enable period and a second output enable period and performing or skipping a reset operation on the data pad by adjusting a resistance value of a path of the internal current during an output disable period between the first and second output enable periods, in response to the reset control signal and the input data control signal, wherein the control circuit determines whether to activate the input data control signal according to the first data during the first output enable period, wherein the control circuit deactivates the input data control signal regardless of the second data during the second output enable period when a logic level of the second data is equal to a logic level of the third data, and determines whether to activate the input data control signal according to the second data during the second output enable period when the logic level of the second data is different from the logic level of the third data, and wherein the control circuit deactivates an input data control circuit during the output disable period.

11. The semiconductor memory device of claim 10, wherein the internal current is generated in the output circuit, and becomes a basis when the first and second output data are outputted.

12. The semiconductor memory device of claim 10, wherein the output circuit adjusts the resistance value relatively low during the first and second output enable periods, wherein the output circuit performs the reset operation by adjusting the resistance value relatively high when a logic level of the first data is different from a logic level of the second data, and skips the reset operation by keeping the resistance value relatively low when the logic level of the first data is equal to the logic level of the second data, during the output disable period.

13. The semiconductor memory device of claim 10, wherein the control circuit deactivates the reset control signal during the first and second output enable periods, wherein the control circuit deactivates the reset control signal when a logic level of the second data is equal to a logic level of the third data, and activates the reset control signal when the logic level of the second data is different from the logic level of the third data, during the output disable period.

14. The semiconductor memory device of claim 10, wherein the control circuit includes:

a comparison circuit suitable for comparing the second data with the third data, and generating a comparison signal corresponding to the comparison result;

the input data control circuit suitable for generating the input data control signal based on the first and second data and the comparison signal; and a reset control circuit suitable for generating the reset control signal according to the comparison signal.

15. The semiconductor memory device of claim 10, wherein the output circuit includes one or more Josephson junctions.

16. The semiconductor memory device of claim 10, wherein the output circuit includes:

a fixed resistance element coupled between a supply terminal of the high voltage and a first supply node;

a variable resistance element coupled between a supply terminal of the low voltage and a second supply node, and having a resistance value which is varied in response to the reset control signal;

a first current path coupled between the first and second supply nodes, and including one or more first Josephson junctions coupled in series and a first resistance element; and a second current path coupled between the first and second supply nodes, and including one or more second Josephson junctions coupled in series and a second resistance element, wherein the input data control signal is inputted through an input node between each of the first Josephson junctions and the first resistance element, and the first and second output data are outputted through an output node between the second Josephson junctions and the second resistance element.

17. The semiconductor memory device of claim 10, wherein the output circuit includes:

a variable resistance element coupled between a supply terminal of the high voltage and a first supply node, and having a resistance value which is varied in response to the reset control signal;

a fixed resistance element coupled between a supply terminal of the low voltage and a second supply node;

a first current path coupled between the first and second supply nodes, and including one or more first Josephson junctions coupled in series and a first resistance element; and a second current path coupled between the first and second supply nodes, and including one or more second Josephson junctions coupled in series and a second resistance element, wherein the input data control signal is inputted through an input node between the first Josephson junctions and the first resistance element, and the first and second output data are outputted through an output node between the second Josephson junctions and the second resistance element.

18. The semiconductor memory device of claim 10, wherein the output circuit includes:

a first variable resistance element coupled between a supply terminal of the high voltage and a first supply node, and having a resistance value which is varied in response to the reset control signal;

a second variable resistance element coupled between a supply terminal of the low voltage and a second supply node, and having a resistance value which is varied in response to the reset control signal;

a first current path coupled between the first and second supply nodes, and including one or more first Josephson junctions coupled in series and a first resistance element; and a second current path coupled between the first and second supply nodes, and including one or more second Josephson junctions coupled in series and a second resistance element, wherein the input data control signal is inputted through an input node between the first Josephson junctions and the first resistance element, and the first and second output data are outputted through an output node between the second Josephson junctions and the second resistance element.

19. A transmitter comprising:

an output circuit including a storage circuit, the output circuit configured to output first data during a first output enable period and output second data during a second output enable period, to a data output terminal in a superconducting state or a voltage state depending on values of the first and second data;

a control circuit configured to generate a reset control signal and an input data control signal based on the first and second data; and a power supply circuit configured to supply a high voltage and a low voltage which have target levels during the first and second output enable periods, to the output circuit, wherein, when the first and second data have different values, the high voltage and the low voltage have reset levels during an output disable period between the first and second output enable periods, and when the first and second data have a same value, the high voltage and the low voltage maintain target levels during the output disable period, wherein the storage circuit is configured to store sequentially inputted data and sequentially output the stored data as the first and second data, and output the stored first data as third data when the second data is read, wherein the control circuit determines whether to activate the input data control signal according to the first data during the first output enable period, wherein the control circuit deactivates the input data control signal regardless of the second data during the second output enable period when a logic level of the second data is equal to a logic level of the third data, and determines whether to activate the input data control signal according to the second data during the second output enable period when the logic level of the second data is different from the logic level of the third data, and wherein the control circuit deactivates an input data control circuit during the output disable period.

20. The transmitter of claim 19, wherein the transmission circuit includes:

an input current path including first Josephson junctions and a first resistance element coupled in series; and an output current path including second Josephson junctions and a second resistance element coupled in series.

21. The transmitter of claim 20, further comprising:

a comparison circuit configured to compare the values of the first and second data to generate a comparison signal; and a reset control circuit configured to generate a reset control signal according to the comparison signal, and provide the reset control signal to the power supply circuit, wherein the reset control signal is deactivated during the output disable period when the first and second data have a same value.

22. The transmitter of claim 21, further comprising:

the input data control circuit configured to generate an input data control signal based on the first and second data and the comparison signal, and provide the input data control signal to the output circuit.

23. A transmitter comprising:

a transmission circuit configured to output first data during a first output enable period and output second data during a second output enable period, to an output terminal in a superconducting state or a voltage state depending on values of the first and second data;

a storage circuit configured to store sequentially inputted data and sequentially output the stored data as the first and second data;

a control circuit suitable for generating a reset control signal and an input data control signal based on the first data and the second data; and a variable resistance element coupled to at least one of first and second supply voltage terminals of the transmission circuit, and configured to have, in response to the reset control signal, a first resistance value to allow at least a supply voltage having constant target level to be supplied to the transmission circuit during the first and second data output enable periods, and a second resistance value to block supplying of the supply voltage to the transmission circuit during an output disable period between the first and second output enable periods, wherein, when the first and second data have a same value, the reset control signal is deactivated to allow at least the supply voltage to be supplied to the transmission circuit during the output disable period, wherein the storage circuit is suitable for storing the first data and outputting the stored first data as third data when the second data is read, wherein the control circuit determines whether to activate the input data control signal according to the first data during the first output enable period, wherein the control circuit deactivates the input data control signal regardless of the second data during the second output enable period when a logic level of the second data is equal to a logic level of the third data, and determines whether to activate the input data control signal according to the second data during the second output enable period when the logic level of the second data is different from the logic level of the third data, and wherein the control circuit deactivates an input data control circuit during the output disable period.

24. The transmitter of claim 23, wherein the transmission circuit includes:

an input current path including first Josephson junctions and a first resistance element coupled in series; and an output current path including second Josephson junctions and a second resistance element coupled in series.

25. The transmitter of claim 24, further comprising:

a comparison circuit configured to compare the values of the first and second data to generate a comparison signal; and a reset control circuit configured to generate the reset control signal according to the comparison signal, and provide the reset control signal to the variable resistance element, wherein the reset control signal is deactivated during the output disable period when the first and second data have a same value.

26. The transmitter of claim 25, further comprising:
the input data control circuit configured to generate an input data control signal based on the first and second data and the comparison signal, and provide the output control signal to the transmission circuit.

\* \* \* \* \*